United States Patent
Uchino et al.

(10) Patent No.: US 12,287,202 B2
(45) Date of Patent: Apr. 29, 2025

(54) VIBRATING-TYPE GYROSCOPE ELEMENT AND ANGULAR VELOCITY SENSOR COMPRISING SAME

(71) Applicant: Sumitomo Precision Products Co., Ltd., Hyogo (JP)

(72) Inventors: Ryohei Uchino, Hyogo (JP); Takafumi Moriguchi, Hyogo (JP); Naoki Okimoto, Hyogo (JP)

(73) Assignee: SUMITOMO PRECISION PRODUCTS CO., LTD., Amagasaki (JP)

( * ) Notice: Subject to any disclaimer, the term of this patent is extended or adjusted under 35 U.S.C. 154(b) by 287 days.

(21) Appl. No.: 18/002,823

(22) PCT Filed: Jun. 24, 2021

(86) PCT No.: PCT/JP2021/024032
§ 371 (c)(1),
(2) Date: Dec. 21, 2022

(87) PCT Pub. No.: WO2022/004562
PCT Pub. Date: Jan. 6, 2022

(65) Prior Publication Data
US 2023/0243653 A1    Aug. 3, 2023

(30) Foreign Application Priority Data
Jul. 3, 2020  (JP) ................. 2020-115611

(51) Int. Cl.
*G01C 19/5684* (2012.01)
*B81B 3/00* (2006.01)
(Continued)

(52) U.S. Cl.
CPC ........ *G01C 19/5684* (2013.01); *B81B 3/0086* (2013.01); *G01C 19/5719* (2013.01);
(Continued)

(58) Field of Classification Search
None
See application file for complete search history.

(56) References Cited

U.S. PATENT DOCUMENTS

| 7,958,781 B2 * | 6/2011 | Fell ................... G01C 19/5684 |
| | | 73/504.13 |
| 11,656,077 B2 * | 5/2023 | Prikhodko ............. G01C 19/24 |
| | | 73/504.04 |

(Continued)

FOREIGN PATENT DOCUMENTS

| JP | 2009-115559 A | 5/2009 |
| JP | 2011-027560 A | 2/2011 |

(Continued)

OTHER PUBLICATIONS

English Translation of JP-2011025762-A provided by IP.com (Year: 2024).*

(Continued)

*Primary Examiner* — Laura Martin
*Assistant Examiner* — Mark A Shabman
(74) *Attorney, Agent, or Firm* — Alston & Bird LLP

(57) ABSTRACT

A vibrating-type gyroscope element includes a fixed part, a resonator having a cos Nθ (N is a natural number of two or more) mode of vibration, support parts, and electrodes. The electrodes are arranged in 4N orientations arranged in an outer circumferential direction of the resonator. The electrodes include a primary driving electrode, a primary pickoff electrode, a secondary pickoff electrode, and a secondary driving electrode. The primary pickoff electrode is arranged in the same orientation as that of the primary driving electrode, and the secondary driving electrode is arranged in the same orientation as that of the secondary pickoff electrode.

12 Claims, 17 Drawing Sheets

(51) Int. Cl.
*G01C 19/5719* (2012.01)
*H10N 30/30* (2023.01)
(52) U.S. Cl.
CPC .... *H10N 30/302* (2023.02); *B81B 2201/0242* (2013.01); *B81B 2203/04* (2013.01)

(56) References Cited

U.S. PATENT DOCUMENTS

| | | | |
|---|---|---|---|
| 2011/0167911 A1* | 7/2011 | Fell | G01C 19/5684 |
| | | | 73/504.12 |
| 2015/0354959 A1* | 12/2015 | Senkal | G01C 19/5684 |
| | | | 73/504.13 |
| 2017/0038211 A1* | 2/2017 | Ayazi | H03J 1/06 |
| 2019/0041212 A1 | 2/2019 | Baxter | |

FOREIGN PATENT DOCUMENTS

| | | | |
|---|---|---|---|
| JP | 2011-027561 A | | 2/2011 |
| JP | 2011025762 A | * | 2/2011 |
| JP | 5410518 B2 | | 2/2014 |
| JP | 2019-032302 A | | 2/2019 |

OTHER PUBLICATIONS

International Search Report and Written Opinion for PCT/JP2021/024032 (ISR/JP) mailed Sep. 21, 2021 (9 pages).

\* cited by examiner

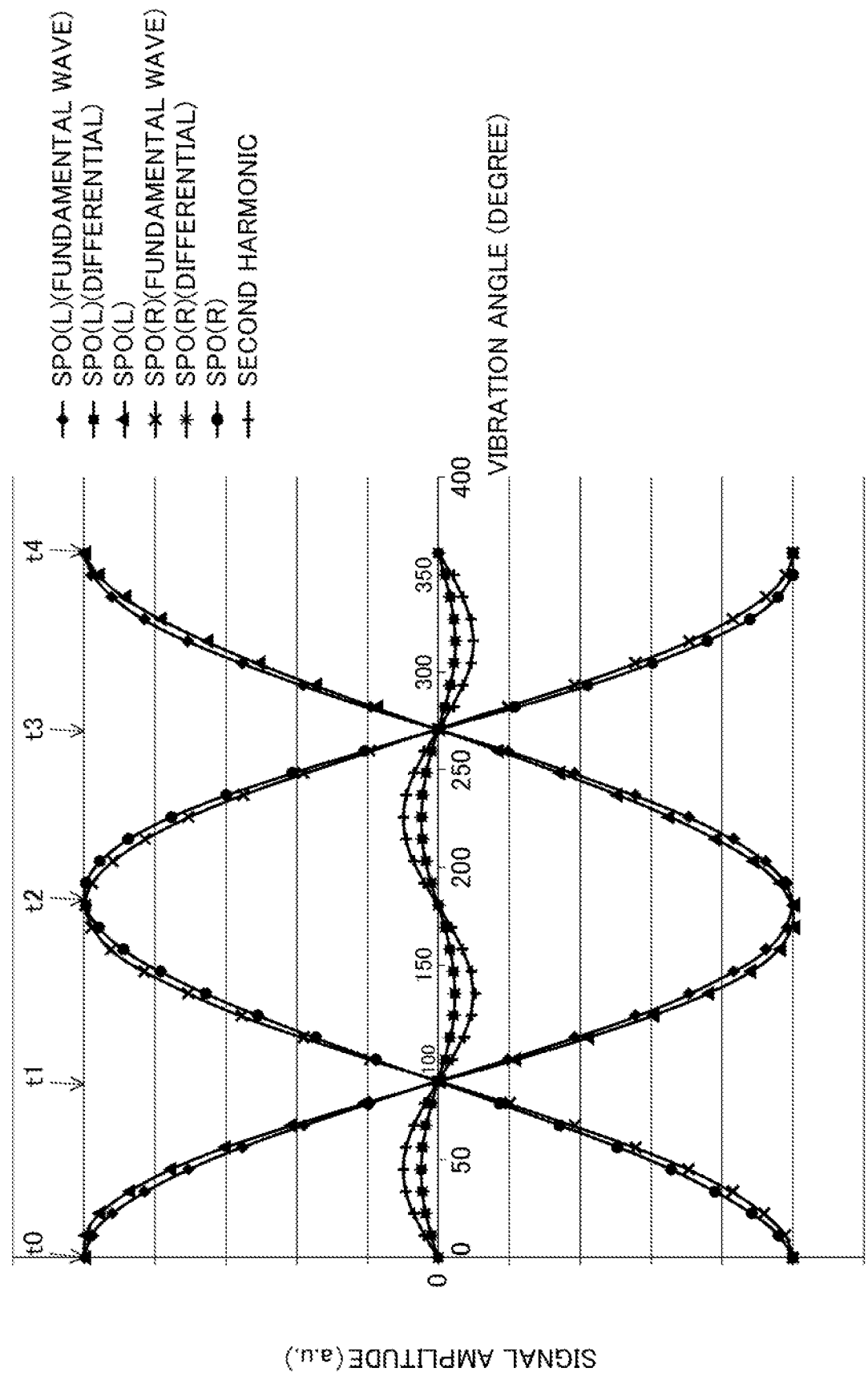

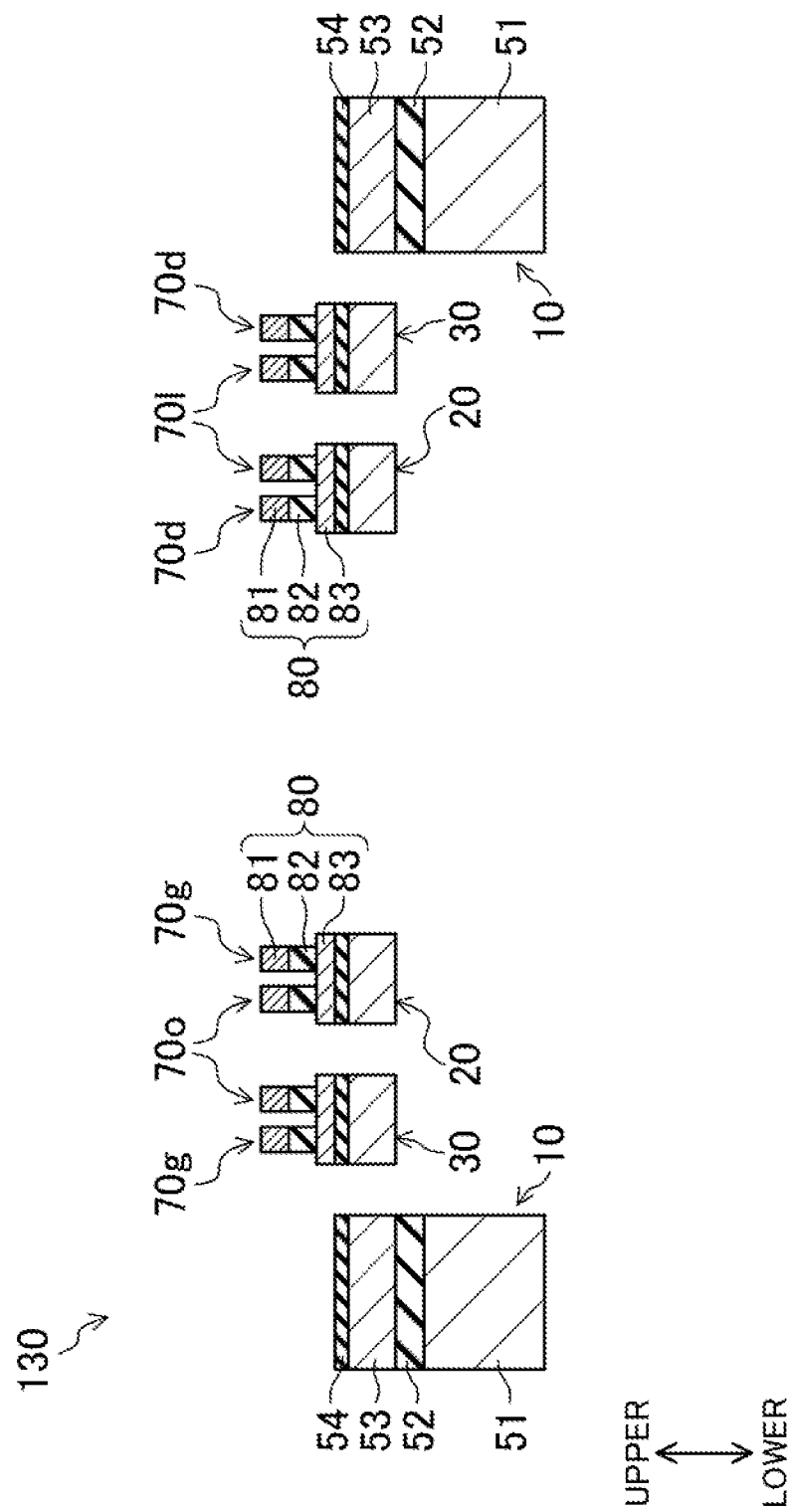

VIBRATING-TYPE GYROSCOPE ELEMENT AND ANGULAR VELOCITY SENSOR COMPRISING SAME

CROSS REFERENCE TO RELATED APPLICATIONS

This application is a National Stage Application, filed under 35 U.S.C. § 371, of International Application No. PCT/JP2021/024032, filed Jun. 24, 2021, which international application claims priority to and the benefit of Japanese Application No. 2020-115611, filed Jul. 3, 2020; the contents of both of which as are hereby incorporated by reference in their entireties.

BACKGROUND

Technical Field

The present disclosure relates to a vibrating-type gyroscope element and an angular velocity sensor including the vibrating-type gyroscope element.

Description of Related Art

Vibrating-type gyroscope elements have been known as gyroscope elements for use in an angular velocity sensor. For example, electromagnetic gyroscope elements have been well-known, which have such a structure that is provided with a plurality of electrodes on a surface of a ring-shaped resonator and configured to apply a magnetic field in a direction crossing surfaces of the electrodes (see, e.g., Japanese Patent No. 5410518 and Japanese Unexamined Patent Publication No. 2019-032302).

The electromagnetic gyroscope elements are so configured that, under the magnetic field application, the resonator is vibrated by resonance vibration (which may be also referred to as first order vibration hereinafter) caused by a current of a frequency equivalent to a resonance frequency of the resonator applied via some of the electrodes (hereinafter referred to as primary driving electrodes). If an angular velocity occurs when the resonator receives a Coriolis force, a voltage generated at other electrodes (hereinafter referred to as a secondary pickoff electrode) is detected as a signal for calculating an angular velocity. Gyroscope elements are typically configured with electrodes (hereinafter referred to as primary pickoff electrodes) for detecting the first order vibration for stabilization of the amplitude and frequency of the first order vibration, and with electrodes (hereinafter referred to as secondary driving electrodes) for driving the resonator on the basis of the signal detected by the secondary pickoff electrodes such that second order vibration is canceled.

On the other hand, in an angular velocity sensor having a vibrating-type gyroscope element, an output signal would be superimposed with a bias component sometimes. The bias component is also called, for example, a zero-point output or an offset, and is caused due to, e.g., angular offset among the plurality of electrodes provided in the vibrating-type gyroscope element or uneven magnetic field application in the case of the electromagnetic gyroscope element.

In order to remove such a bias component, for example, Japanese Unexamined Patent Publication No. 2009-115559 discloses such a configuration that drive control is performed such that a primary driving electrode and a primary pickoff electrode (hereinafter, such a pair will be sometimes referred to as a primary pair) are periodically switched over with a secondary driving electrode and a secondary pickoff electrode (hereinafter, such a pair will be sometimes referred to as a secondary pair). In this case, a difference between output signals before and after the switching-over is eliminated so that the bias component is canceled out.

BRIEF SUMMARY

However, the above-described angular offset is mainly caused due to, e.g., mask misalignment or resist pattern distortion at gyroscope element production, and generally, is not symmetrical among the plurality of electrodes.

Thus, the bias component which cannot be canceled even by use of the method disclosed in Japanese Unexamined Patent Publication No. 2009-115559 remains in the output signal, leading to an error in an angular velocity detection value. Particularly, such a remaining bias component leads to a problem in a case where a highly accurate detection of the angular velocity is required.

The present disclosure has been made in view of the foregoing, and it is an object of the present disclosure to provide a vibrating-type gyroscope element capable of reducing a bias component included in an output signal and an angular velocity sensor including the vibrating-type gyroscope element.

In order to accomplish the above-described object, a vibrating-type gyroscope element according to the present disclosure includes at least a fixed part, a resonator, a plurality of support parts connecting the resonator to the fixed part and vibratably supporting the resonator, and a plurality of electrodes formed in the plane of the resonator, the resonator having a cos Nθ (N is a natural number of two or more) mode of vibration, the plurality of electrodes being arranged in such 4N orientations that the axes of the plurality of electrodes are arranged at equiangular intervals in an outer circumferential direction of the resonator, the plurality of electrodes including: a primary driving electrode that excites first order vibration of the resonator in the cos Nθ mode; a primary pickoff electrode that detects the first order vibration; a secondary pickoff electrode that detects second order vibration of the resonator; and a secondary driving electrode that drives the resonator such that the second order vibration is canceled, the primary pickoff electrode being arranged in an orientation identical to that of the primary driving electrode, and the secondary driving electrode being arranged in an orientation identical to that of the secondary pickoff electrode.

An angular velocity sensor according to the present disclosure includes at least the vibrating-type gyroscope element, a primary AC power supply that applies an AC power with a predetermined frequency to the primary driving electrode, a primary detector that detects a voltage signal generated at the primary pickoff electrode, a secondary AC power supply that applies an AC power to the secondary driving electrode, a secondary detector that detects a voltage signal generated at the secondary pickoff electrode, and a computing unit that calculates an angular velocity based on an output signal from the secondary AC power supply.

According to the vibrating-type gyroscope element of the present disclosure, the bias component included in the output signal can be reduced. According to the angular velocity sensor of the present disclosure, the bias component included in the output signal from the vibrating-type gyroscope element can be reduced, and the accuracy of detection of the angular velocity can be enhanced.

BRIEF DESCRIPTION OF THE FIGURES

FIG. 8 is a graph schematically showing the vibration angle dependences of an actual output signal from the secondary pickoff electrode and of various signals included therein.

FIG. 16 is a cross-sectional view taken along line XVI-XVI in FIG. 15.

DETAILED DESCRIPTION OF VARIOUS EMBODIMENTS

Embodiments of the present disclosure will be described below with reference to the drawings. Note that description of the preferred embodiments below is merely illustrative in nature and is not intended to limit the scope, application, and use of the present disclosure.

First Embodiment

[Configuration of Vibrating-Type Gyroscope Element]

Figure 1:
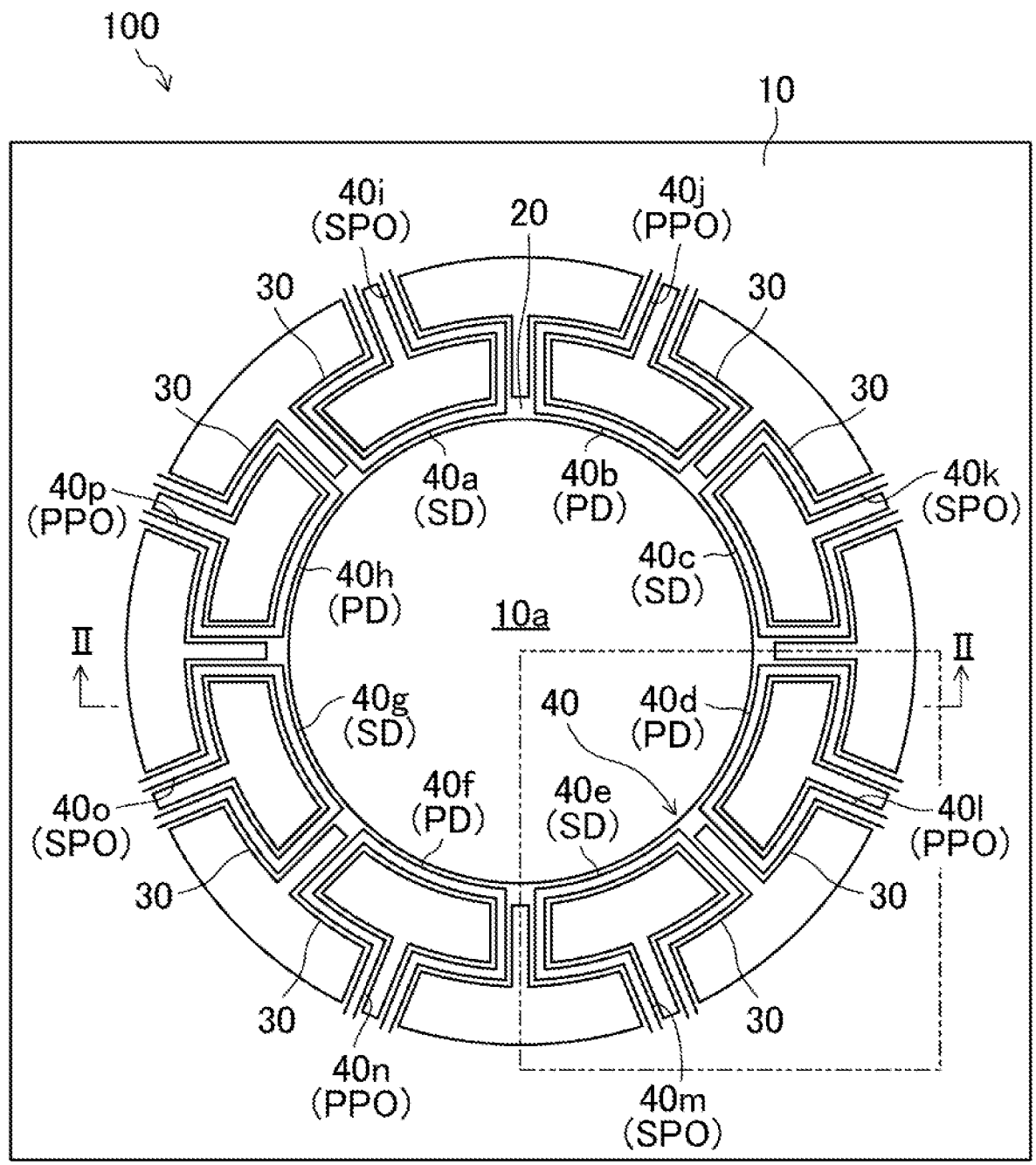
FIG. 1 is a plan view of a vibrating-type gyroscope element according to a first embodiment.
Figure 2:
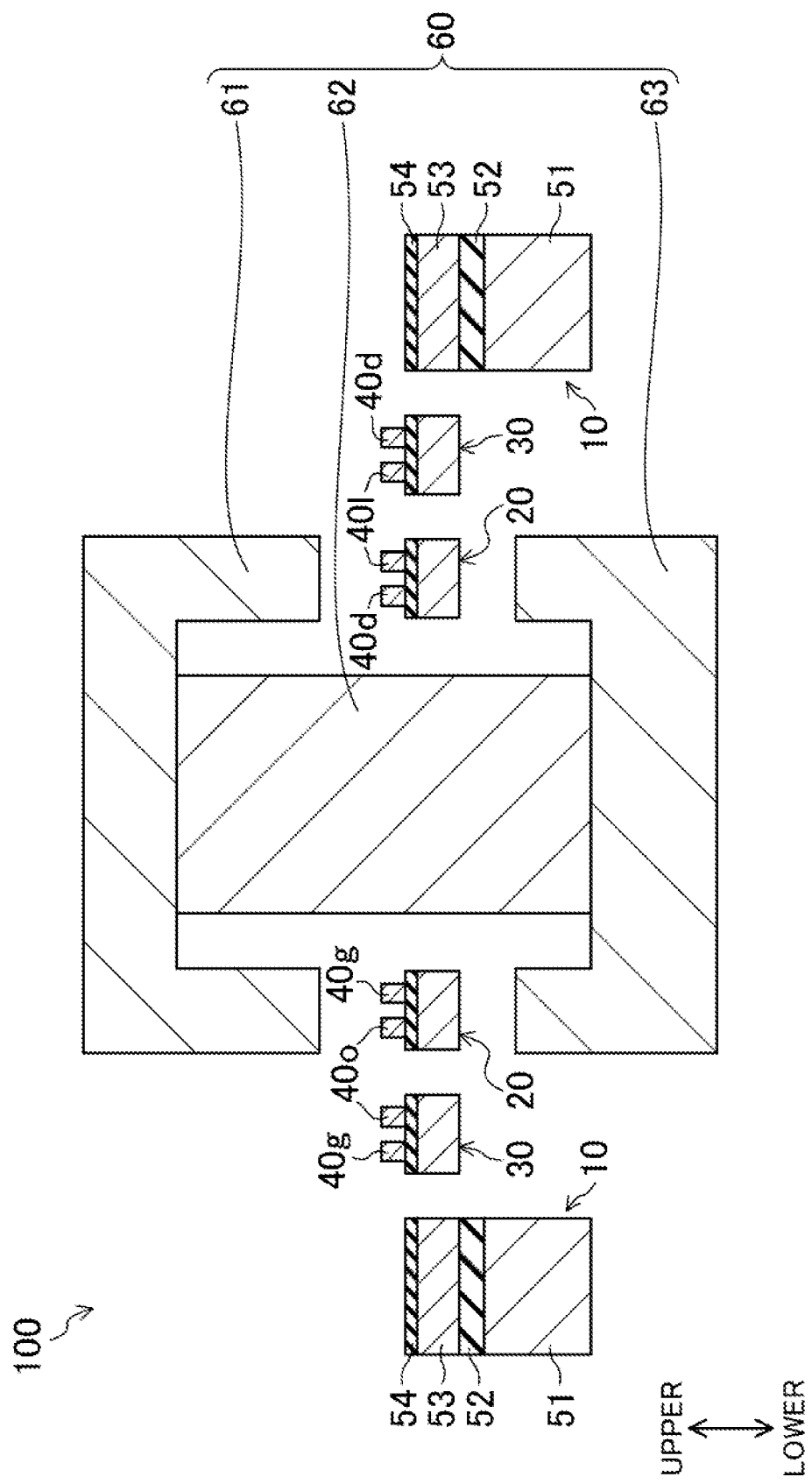
FIG. 2 is a cross-sectional view taken along line II-II in FIG. 1.
Figure 3:
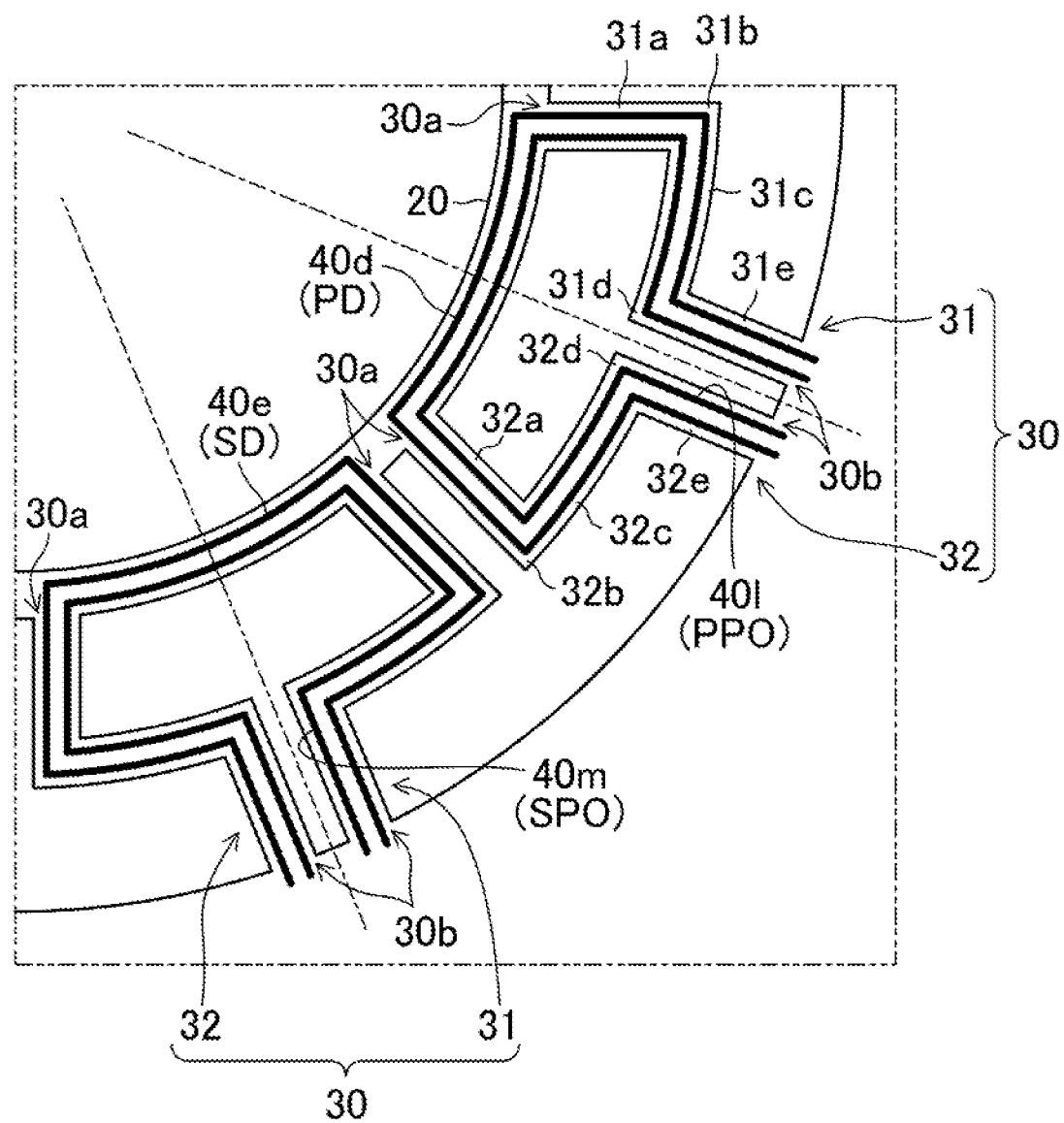
FIG. 3 is an enlarged view of a portion surrounded by the broken line in FIG. 1.

FIG. 1 shows a plan view of a vibrating-type gyroscope element according to a first embodiment, FIG. 2 shows a cross-sectional view taken along line II-II in FIG. 1, and FIG. 3 shows an enlarged view of a portion surrounded by the broken line in FIG. 1.

For the sake of convenience in description, a magnetic field applier 60 is not shown in FIGS. 1 and 3. Also, it should be noted that FIGS. 1 to 3 schematically show the structure of a vibrating-type gyroscope element 100 and do not precisely show an actual dimensional relationship among members.

Note that in description below, a radius direction of a resonator 20 will be sometimes referred to as a radial direction, an outer circumferential direction of the resonator 20 will be sometimes referred to as a circumferential direction, and a direction crossing the radial direction and the circumferential direction will be sometimes referred to as an axial direction. Moreover, in the radial direction, the direction toward the center of the resonator 20 will be sometimes referred to as inner, inward, or inside, and the direction toward the outer circumference of the resonator 20 will be sometimes referred to as outer, outward, or outside. In the axial direction, the direction toward where an upper yoke 61 (see FIG. 2) is provided will be sometimes referred to as upper, upward, or upside, and the direction toward where a lower yoke 63 (see FIG. 2) is provided will be sometimes referred to as lower, downward, or downside. Note that an upper surface of each member described below will be sometimes referred to as a front surface and a lower surface will be sometimes referred to as a back surface.

Moreover, one or more primary driving electrodes will be sometimes collectively referred to as a primary driving electrode PD, and one or more primary pickoff electrodes will be sometimes collectively referred to as a primary pickoff electrode PPO. In addition, one or more secondary driving electrodes will be sometimes collectively referred to as a secondary driving electrode SD, and one or more secondary pickoff electrodes will be sometimes collectively referred to as a secondary pickoff electrode SPO.

As shown in FIGS. 1 and 2, the vibrating-type gyroscope element 100 has a fixed part 10, the resonator 20, a plurality of support parts 30, a plurality of electrodes 40a to 40p, and the magnetic field applier 60.

As shown in FIG. 1, the fixed part 10 has an opening 10a at the center thereof, and the resonator 20, the plurality of support parts 30, the plurality of electrodes 40a to 40p, and the magnetic field applier 60 are arranged inside the opening 10a. As shown in FIG. 2, the fixed part 10 is a member having a lamination structure in which a first silicon layer 51, a silicon oxide layer (insulating layer) 52, and a second silicon layer 53 are laminated in this order. Further, a silicon oxide film 54 is provided on the front surface of the second silicon layer 53.

The resonator 20 is a circular ring-shaped member obtained by fabricating the second silicon layer 53, and has a vibration mode of cos 2θ.

The support parts 30 are members obtained by fabricating the second silicon layer 53, and are formed integrally with the resonator 20. Moreover, the support parts 30 connect the resonator 20 to the fixed part 10. The support parts 30 support the resonator 20 in a cantilever manner, from another point of view, vibratably support the resonator 20.

As illustrated in FIG. 3, each of the plurality of support parts 30 has a first leg 31 and a second leg 32. Each of the first leg 31 and the second leg 32 has a first end portion 30a and a second end portion 30b. The first end portions 30a are each connected to different locations of the resonator 20 at first intervals. The second end portions 30b are each connected to different locations of the fixed part 10 at second intervals narrower than the first interval.

The first leg 31 has a first portion 31a extending from the first end portion 30a outward in the radial direction of the resonator 20 and a second portion 31c bent at a first bent portion 31b at one end of the first portion 31a and extending in parallel with the outer circumference of the resonator 20. Further, the first leg 31 has a third portion 31e bent at a second bent portion 31d at one end of the second portion 31c and extending outward to the second end portion 30b in the radial direction of the resonator 20.

Similarly, the second leg 32 has a first portion 32a extending from the first end portion 30a outward in the radial direction of the resonator 20 and a second portion 32c bent at a first bent portion 32b at one end of the first portion 32a and extending in parallel with the outer circumference of the resonator 20. Further, the second leg 32 has a third portion 32e bent at a second bent portion 32d at one end of the second portion 32c and extending outward to the second end portion 30b in the radial direction of the resonator 20.

The second portion 31c of the first leg 31 and the second portion 32c of the second leg 32 extend to the second bent portions 31d, 32d so as to approach each other. The third portion 31e of the first leg 31 and the third portion 32e of the second leg 32 extend in parallel with each other from the second bent portions 31d, 32d to the second end portions 30b with a predetermined space kept therebetween. The first leg 31 and the second leg 32 are arranged symmetrically with respect to a virtual line passing through the center of the resonator 20 and extending between the third portions 31e, 32e.

The electrodes 40a to 40p are conductive members arranged circumferentially in the plane of the resonator 20. Moreover, each of the electrodes 40a to 40p is formed so as to extend from the fixed part 10 on the front surface of the support part 30. For example, as shown in FIG. 3, the electrode 40d extends from the second end portion 30b of the first leg 31 to the second end portion 30b of the second leg 32 along the resonator 20 between the first leg 31 and the first end portions 30a, and the second leg 32. Moreover, the electrode 40d is formed on the front surface of the silicon oxide film 54. Note that in description below, the electrodes 40a to 40p will be sometimes collectively referred to as an electrode 40 in the case of not particularly focusing on an arrangement orientation at which the electrode is arranged or what function the electrode has. Note that some or all of the electrodes 40 different in the arrangement orientations but identical in their function are connected with wiring (not shown) provided in the fixed part 10. Note that the "orientation" in the present Description corresponds to a "region" where the electrode 40 is arranged and the orientations are continuous in a case where these regions are adjacent to each other. Moreover, the electrode 40 may be arranged across one orientation. In addition, the size of the electrode 40 may be smaller than the size of one orientation (region). A plurality of electrodes 40 may be arranged in an orientation.

As shown in FIGS. 1 and 3, two electrodes 40 are provided in such a way that, in the plane of the support part 30 and the resonator 20, the two electrodes 40 extend in parallel with each other with a space kept therebetween. As such, two electrodes 40e, 40m are provided in such a way that, in the plane of the support part 30 and the resonator 20, the two electrodes 40e, 40m extend in parallel with each other with a space kept therebetween. Note that in the present Description, "parallel" includes not only a case where two members are arranged in parallel with each other, but also a case where two members are arranged in contact with each other or arranged and oriented with a space kept therebetween to such an extent that these members do not cross each other.

In the illustration of FIG. 3, of two electrodes 40d, 40l provided on the front surface of one support part 30 and arranged in parallel with each other circumferentially, the electrode 40d arranged outside is the primary driving electrode PD, and the electrode 40l arranged inside is the primary pickoff electrode PPO. Of two electrodes 40e, 40m provided on the front surface of the other support part 30 and arranged in parallel with each other circumferentially, the electrode 40e arranged outside is the secondary driving electrode SD, and the electrode 40m arranged inside is the secondary pickoff electrode SPO. That is, the primary pickoff electrode PPO is arranged in the same orientation as that of the primary driving electrode PD, and the secondary driving electrode SD is arranged in the same orientation as that of the secondary pickoff electrode SPO.

As illustrated in FIG. 1, the pairs of the primary driving electrode PD and the primary pickoff electrode PPO and the pairs of the secondary driving electrode SD and the secondary pickoff electrode SPO are alternately arranged in the circumferential direction. Moreover, the number of pairs of the primary driving electrode PD and the primary pickoff electrode PPO and the number of pairs of the secondary driving electrode SD and the secondary pickoff electrode SPO are the same as each other.

A certain pair of the primary driving electrode PD and the primary pickoff electrode PPO and another pair, which is the closest to the certain pair, of the primary driving electrode PD and the primary pickoff electrode PPO are arranged at locations apart from each other by 90 degrees. A certain pair of the secondary driving electrode SD and the secondary pickoff electrode SPO and another pair, which is the closest to the certain pair, of the secondary driving electrode SD and the secondary pickoff electrode SPO are arranged at locations apart from each other by 90 degrees. A certain pair of the primary driving electrode PD and the primary pickoff electrode PPO and another pair, which is the closest to the certain pair, of the secondary driving electrode SD and the secondary pickoff electrode SPO are arranged at locations apart from each other by 45 degrees.

Note that each of the plurality of electrodes 40a to 40p is provided with electrode pads (not shown) at both end portions. Four primary pickoff electrodes PPO are connected in series through the electrode pads. Similarly, four secondary pickoff electrodes SPO are connected in series through the electrode pads.

As shown in FIG. 2, the magnetic field applier 60 has the upper yoke 61, a magnet 62, and the lower yoke 63. Each of the upper yoke 61 and the lower yoke 63 is a bottomed tubular member made of a magnetic material such as iron. The upper yoke 61 and the lower yoke 63 are arranged such that a tubular portion of the upper yoke 61 and a tubular portion of the lower yoke 63 face each other with a space kept therebetween in the axial direction. The resonator 20 is arranged between the tubular portion of the upper yoke 61 and the tubular portion of the lower yoke 63. The resonator 20 is arranged between the tubular portion of the upper yoke 61 and the tubular portion of the lower yoke 63 with a space kept between the resonator 20 and each tubular portion in the axial direction.

One of upper or lower portions of the magnet 62 is the N-pole, and the other one of the upper or lower portions is the S-pole. The magnet 62 is held by the upper yoke 61, the lower yoke 63, or both thereof, and is arranged in a fixed manner inside the resonator 20.

A magnetic flux flowing from one magnetic pole of the magnet 62 passes through one of the upper yoke 61 or the lower yoke 63, and reaches the resonator 20 and the electrodes 40a to 40p provided on the front surface of the resonator 20. Further, the magnetic flux passes through the resonator 20 and the electrodes 40a to 40p, and flows into the other magnetic pole of the magnet 62 through the other one of the upper yoke 61 or the lower yoke 63.

As described above, the magnetic field applier 60 applies a magnetic field to the plurality of electrodes 40a to 40p in a direction crossing the front surface of the resonator 20, which is the axial direction in this case. The magnetic field applier 60 is supported by a support substrate (not illustrated) so as to keep the positional relationship thereof with the resonator 20 in the radial direction and the axial direction.

The vibrating-type gyroscope element 100 excluding the magnetic field applier 60 is, for example, a micro electro mechanical systems (MEMS) element obtained in such a manner that a well-known silicon on insulator (SOI) substrate is fabricated using a micromachining technique to which a semiconductor micromachining technique is applied.

The MEMS element is manufactured as follows, for example. An SOI substrate having a first silicon layer 51, a silicon oxide layer 52, and a second silicon layer 53 is thermally oxidized, and in this manner, a silicon oxide film 54 is formed on the front surface of the second silicon layer 53.

Next, a plurality of electrodes 40a to 40p is formed on the front surface of the silicon oxide film 54 by use of a mask pattern (not shown). For example, the plurality of electrodes 40a to 40p is formed in such a manner that a metal film is applied to the front surface of the silicon oxide film 54 via the mask pattern.

The silicon oxide film 54 and the second silicon layer 53 are etched away via another mask pattern (not shown), until the silicon oxide layer 52 is exposed. The basic shapes of support parts 30 and a resonator 20 are formed through these steps.

Next, in a state in which the front surfaces of the electrodes 40a to 40p, the support parts 30, and the resonator 20 are protected with, e.g., wax, the first silicon layer 51 located below the support parts 30 and the resonator 20 is etched away via a mask pattern (not shown) corresponding to an opening 10a of a fixed part 10. Further, the silicon oxide layer 52 is etched away via the same mask pattern, thereby obtaining the above-described MEMS element.

The etching of the first silicon layer 51 and the silicon oxide layer 52 may be dry etching or wet etching. In either case, etchant having a high etch selectivity for a layer as a base layer of an etching layer may be used preferably.

[Configuration and Operation of angular velocity Sensor]

Figure 4:
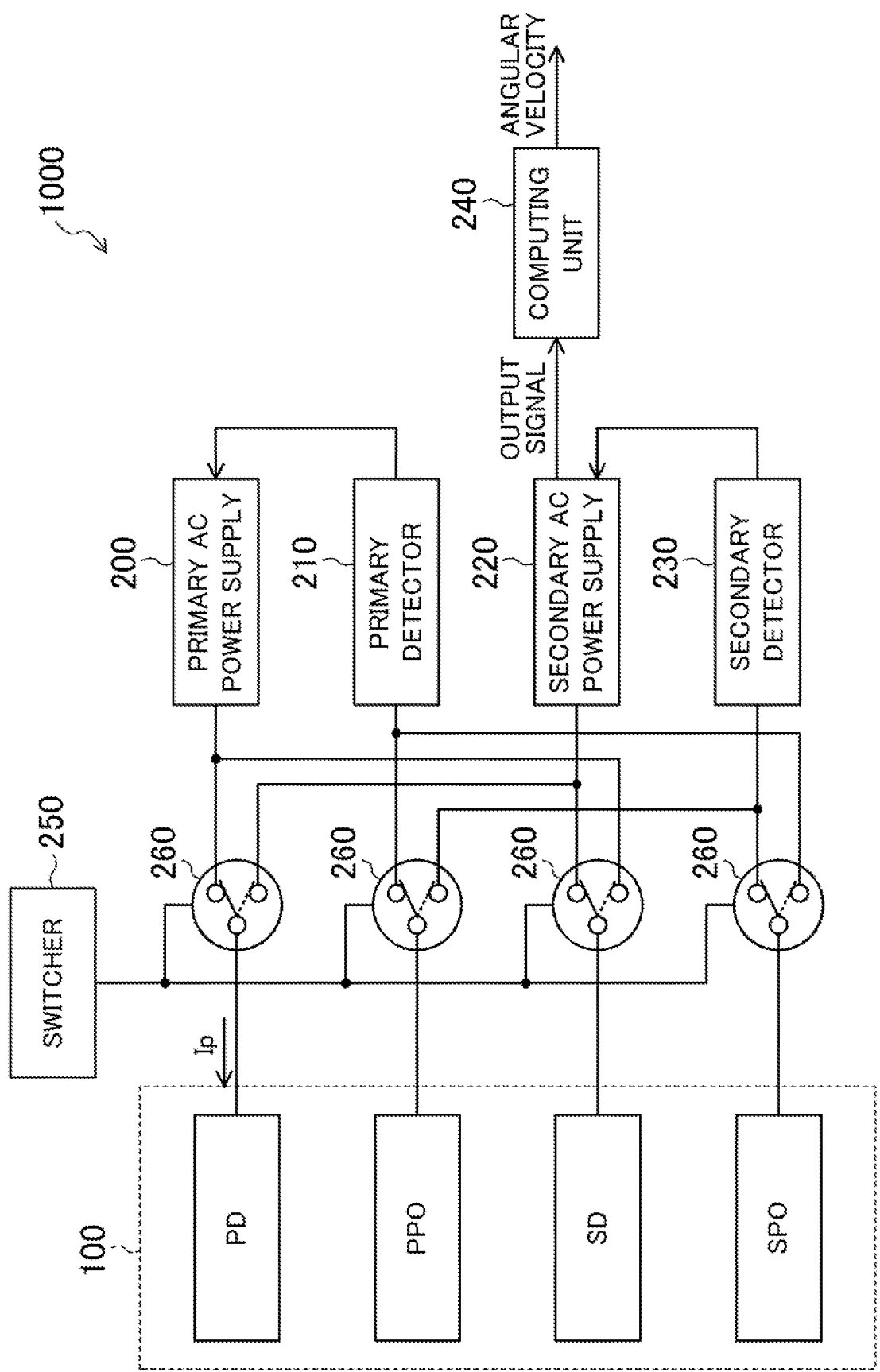
FIG. 4 is a schematic configuration diagram of a circuit block of an angular velocity sensor.

FIG. 4 shows a schematic configuration diagram of a circuit block of an angular velocity sensor. Note that for the sake of convenience in description, only the primary driving electrode PD, the primary pickoff electrode PPO, the secondary driving electrode SD, and the secondary pickoff electrode SPO of the vibrating-type gyroscope element 100 are schematically illustrated in FIG. 4.

As shown in FIG. 4, an angular velocity sensor 1000 includes the vibrating-type gyroscope element 100, a primary AC power supply 200, a primary detector 210, a secondary AC power supply 220, a secondary detector 230, a computing unit 240, a switcher 250, and a plurality of switches 260.

The primary AC power supply 200 is connected to four primary driving electrodes PD. The primary detector 210 is connected to four primary pickoff electrodes PPO connected in series. The secondary AC power supply 220 is connected to four secondary driving electrodes SD. The secondary detector 230 is connected to four secondary pickoff electrodes SPO connected in series. The computing unit 240 is connected to the secondary AC power supply 220.

Operation of the angular velocity sensor 1000 will be described below.

When an AC current Ip is supplied from the primary AC power supply 200 to the primary driving electrodes PD, Lorentz force is applied to the primary driving electrodes PD in a direction crossing both of the direction of the magnetic field applied from the magnetic field applier 60 and the direction of the flow of the AC current Ip. That is, the Lorentz force acts in a direction parallel with the front surface of the resonator 20. The resonator 20 provided with the primary driving electrodes PD is deformed by the Lorentz force. The direction of the Lorentz force is reversed periodically according to the frequency of the AC current Ip, and therefore, the resonator 20 vibrates with the same frequency. In this case, the resonator 20 vibrates in the direction parallel with the front surface thereof.

By setting the frequency of the AC current Ip according to the resonance frequency of the resonator 20, first order vibration of the resonator 20 in a cos 2θ mode is excited.

It is necessary to apply the AC current Ip to each of four primary driving electrodes PD in such a way that such first order vibration of the resonator 20 is generated. More specifically, the AC current Ip is set in such a way that two primary driving electrodes PD at the locations apart from each other by 90 degrees receive the AC current Ip flowing in opposite directions, that is, in the clockwise direction and the counterclockwise direction as viewed from above. A relationship of connection among four primary driving electrodes PD and the primary AC power supply 200 may only be required to satisfy the above-described setting, and four primary driving electrodes PD may be connected in series with or in parallel with the primary AC power supply 200.

The primary pickoff electrode PPO detects the first order vibration and generates a voltage signal whose level corresponds to the amplitude of the first order vibration, and such a voltage signal is fed back to the primary detector 210. The primary detector 210 outputs an output signal to the primary AC power supply 200 based on the voltage signal generated by the primary pickoff electrode PPO. Based on the output signal from the primary detector 210, the primary AC power supply 200 is controlled, specifically in terms of the amplitude and frequency of the AC current Ip, such that the vibrational frequency and amplitude of the resonator 20 are constant.

Figure 5A:
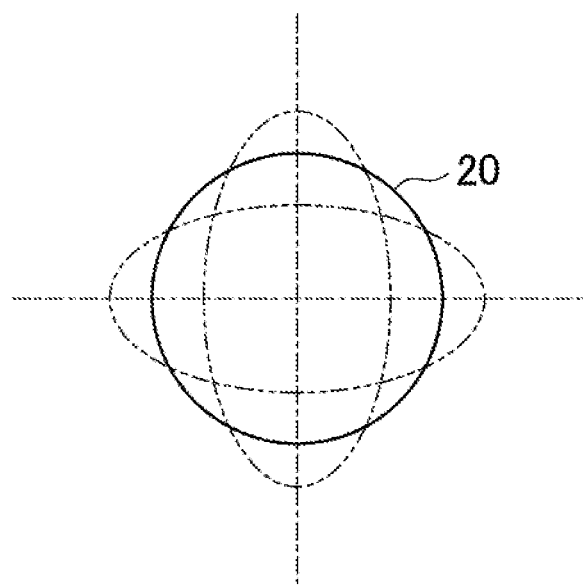
FIG. 5A is a view showing first order vibration.
Figure 5B:
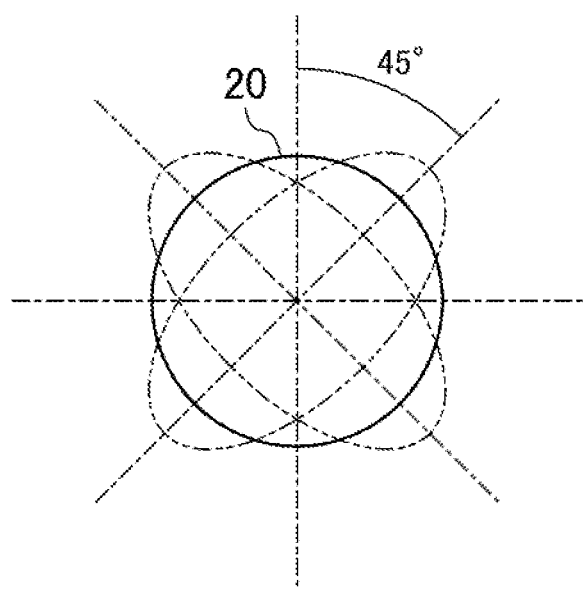
FIG. 5B is a view showing second order vibration.

FIG. 5A schematically illustrates a first order vibration state of the resonator, and FIG. 5B schematically illustrates a second order vibration state of the resonator.

As shown in FIG. 5A, the first order vibration of the circular ring-shaped resonator 20 is generated to deform the resonator 20 periodically into ellipse shapes having main axes perpendicular to each other. In a case where an angular velocity is generated about the axial direction due to application of Coriolis force to the resonator 20, the directions of the above-described main axes of the ellipse shapes change. In the case of the vibrating-type gyroscope element 100 of the present embodiment shown in FIG. 1, the main axes of the ellipses rotate 45 degrees from where the main axes are in the case of the first order vibration, thereby bringing the resonator 20 into the second order vibration state, as shown in FIG. 5B.

The magnetic field is also applied to the secondary pickoff electrodes SPO in a direction crossing the front surfaces thereof. Meanwhile, in response to the vibration of the resonator 20, the secondary pickoff electrodes SPO also vibrate in a direction parallel with the front surfaces thereof. Accordingly, a sinusoidal wave-shaped AC voltage is generated at the secondary pickoff electrodes SPO according to the intensity of the magnetic field and the moving velocity at which the secondary pickoff electrodes SPO vibrate. The moving velocity of the secondary pickoff electrodes SPO is different between the case of the resonator 20 in the first order vibration state and the case of the resonator 20 in the second order vibration state, and therefore, the generated voltage is also different between these states.

The secondary detector 230 detects the voltage generated at the secondary pickoff electrode SPO, and outputs to the secondary AC power supply 220 a signal corresponding to the level of such a voltage.

The output signal from the secondary detector 230 is input to the secondary AC power supply 220. Based on such an output signal, the secondary AC power supply 220 drives the resonator 20 by supplying such a current to the secondary driving electrodes SD that the resonator 20 is driven in such a way that the second order vibration generated at the resonator 20 is canceled. Further, the secondary AC power supply 220 inputs an output signal based on the output current to the computing unit 240.

The computing unit 240 determines, based on the output signal from the secondary AC power supply 220, whether the resonator 20 is in the first order vibration state or the second order vibration state. In a case where it is determined that the resonator 20 is in the second order vibration state, the computing unit 240 calculates the angular velocity based on the output signal from the secondary AC power supply 220.

The angular velocity sensor 1000 switches over primary pairs and secondary pairs at a predetermined timing, acquires an output signal from the vibrating-type gyroscope element 100, and calculates out the angular velocity based on the output signal. For example, the angular velocity is calculated based on a difference between the output signals before and after the switching-over. Such switching-over operation is performed by switching over internal wire connection by the switches 260 and the switcher 250 illustrated in FIG. 4. The "predetermined timing" may be a timing at which the vibrating-type gyroscope element 100 is in a stop state or a timing at which the vibrating-type gyroscope element 100 is in a uniform motion state, for example.

Figure 6A:
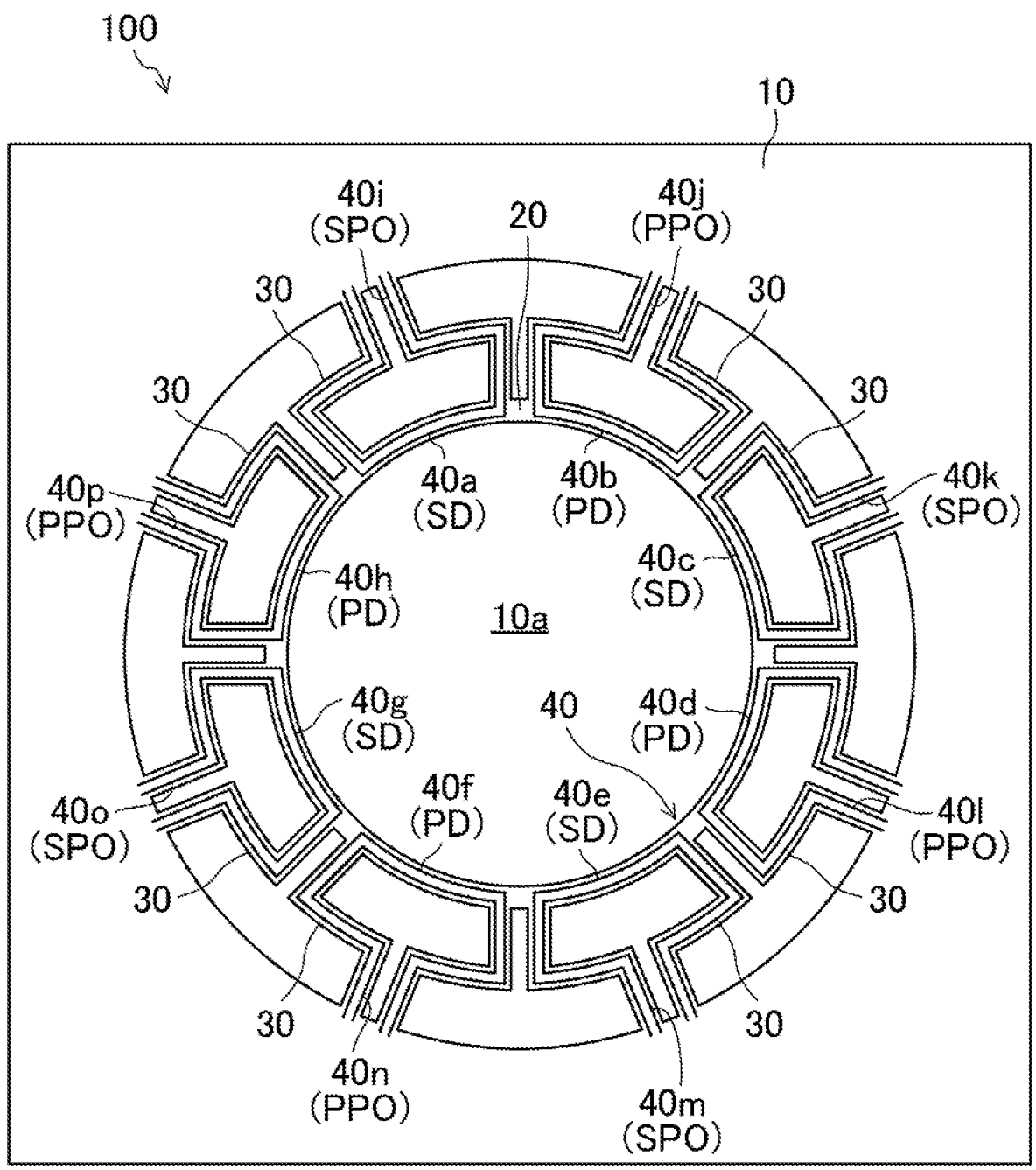
FIG. 6A is a plan view showing electrode arrangement before switching-over primary pairs and a secondary pairs.
Figure 6B:
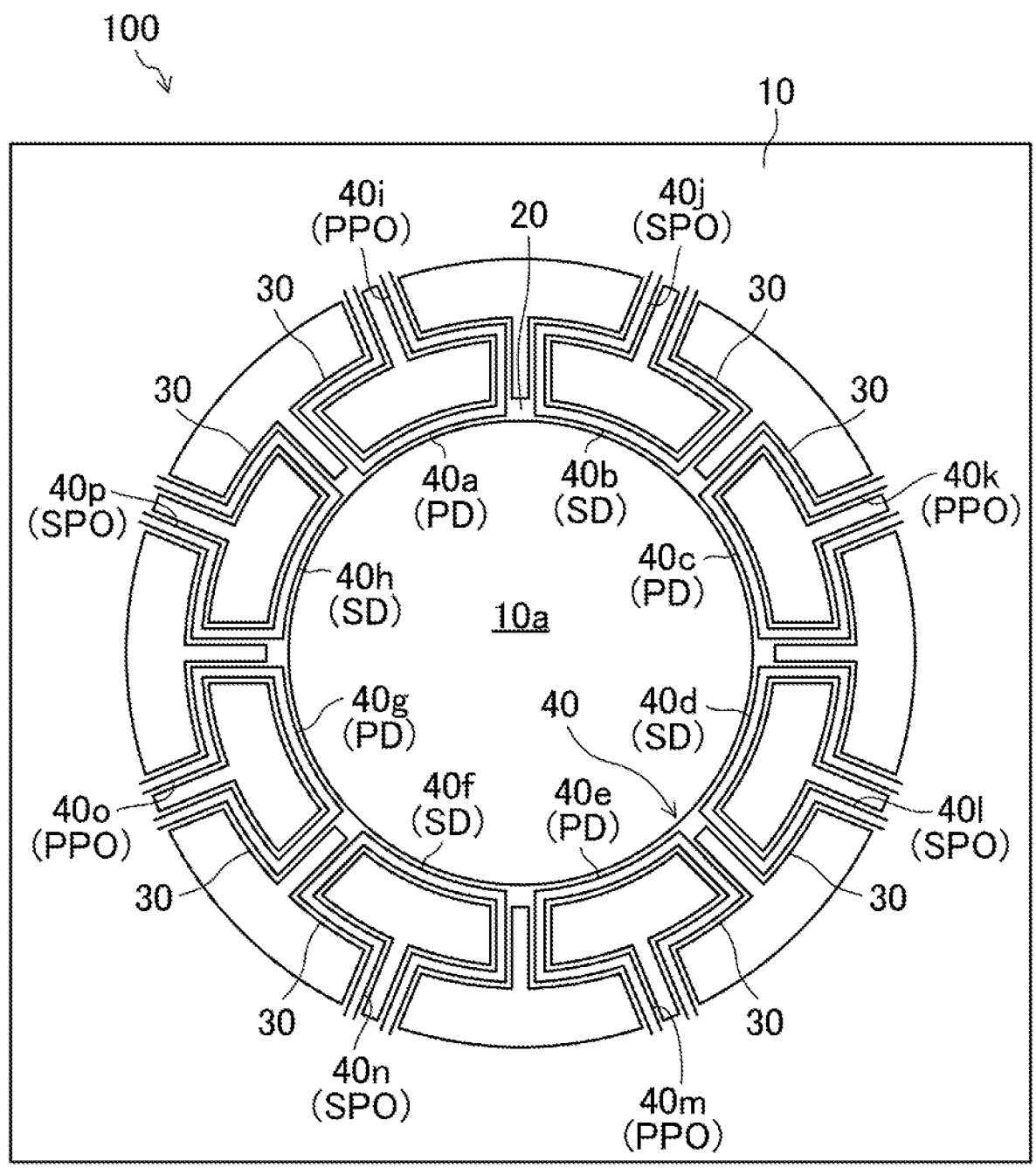
FIG. 6B is a plan view showing electrode arrangement after switching-over the primary pairs and the secondary pairs.

FIG. 6A shows electrode arrangement before switching-over of the primary pairs and the secondary pairs, and FIG. 6B shows electrode arrangement after switching-over of the primary pairs and the secondary pairs.

The electrode arrangement illustrated in FIG. 6A is similar to that illustrated in FIG. 1. Thus, the electrodes 40b, 40d, 40f, 40h function as the primary driving electrodes PD, and the electrodes 40j, 401, 40n, 40p function as the primary pickoff electrodes PPO. Moreover, the electrodes 40a, 40c, 40e, 40g function as the secondary driving electrodes SD, and the electrodes 40i, 40k, 40m, 40o function as the secondary pickoff electrodes SPO.

A control signal is sent to four switches 260 from the switcher 250 so as to switch over wire connection inside the angular velocity sensor 1000 at the predetermined timing. As a result, the electrodes 40b, 40d, 40f, 40h are connected to the secondary AC power supply 220, and function as the secondary driving electrodes SD as shown in FIG. 6B. Similarly, the electrodes 40j, 401, 40n, 40p are connected to the secondary detector 230, and function as the secondary pickoff electrodes SPO. The electrodes 40a, 40c, 40e, 40g are connected to the primary AC power supply 200, and function as the primary driving electrodes PD. The electrodes 40i, 40k, 40m, 40o are connected to the primary detector 210, and function as the primary pickoff electrodes PPO.

Note that the vibrating-type gyroscope element 100, the primary AC power supply 200, the primary detector 210, the secondary AC power supply 220, the secondary detector 230, and the computing unit 240 may be mounted on different substrates or on the same substrate. The vibrating-type gyroscope element 100, the primary AC power supply 200, the primary detector 210, the secondary AC power supply 220, the secondary detector 230, and the computing unit 240 may be housed in different packages (not shown). The vibrating-type gyroscope element 100 and other components may be mounted on different substrates, or may be housed in different packages. In this case, the primary AC power supply 200 and the secondary AC power supply 220 may be mounted on a substrate other than these substrates, or may be housed in a package other than these packages.

[Second Harmonic Component Included in Output Signal from Secondary Pickoff Electrode]

Figure 7A:
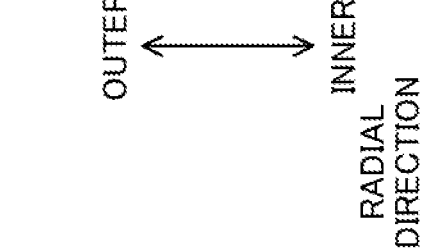
FIG. 7 is a view schematically showing displacements of a secondary pickoff electrode over time during operation.
Figure 7B:
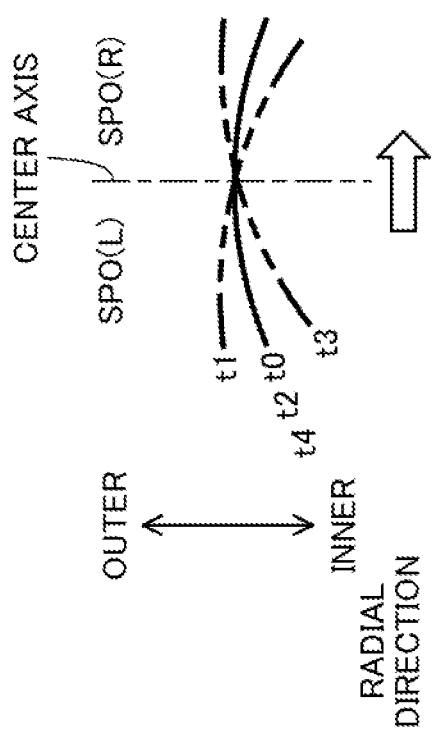

FIG. 7 schematically shows displacements of the secondary pickoff electrode over time during operation, and FIG. 8 schematically shows the vibration angle dependence of an actual output signal from the secondary pickoff electrode and various signals included therein.

The secondary pickoff electrode SPO illustrated in (a) of FIG. 7 and the secondary pickoff electrode SPO illustrated in (b) of FIG. 7 are at locations apart from each other by 90 degrees in the circumferential direction. That is, these two secondary pickoff electrodes SPO are at locations perpendicular to each other. The white arrow mark illustrated in each of (a) and (b) of FIG. 7 indicates the direction of electromotive force of the voltage generated at the secondary pickoff electrode SPO.

The vibration angle illustrated in FIG. 8 is equivalent to the product of the time and the frequency of the AC voltage generated at the secondary pickoff electrode SPO. Moreover, FIG. 8 illustrates, for each of an SPO(L) and an SPO(R) as described later, an actual output signal and various signals included therein.

As described above, when the AC current Ip is applied, the Lorentz force acts on the primary driving electrodes PD due to the magnetic field and the AC current Ip. The Lorentz force is also applied to the resonator 20, and accordingly, the resonator 20 periodically deforms and vibrates.

Although not shown in the figure, the direction of the AC current Ip flowing in the primary driving electrode PD is alternately reversed in four primary driving electrodes PD in order to excite the first order vibration of the resonator 20 in the cos 2θ mode. That is, the primary driving electrodes PD in which the AC current Ip flows in the clockwise direction and the primary driving electrodes PD in which the AC current Ip flows in the counterclockwise direction are alternately arranged.

Thus, forces in the opposite directions in the radial direction act on both ends of a portion, which is formed in the plane of the reasoner 20, of the secondary pickoff electrode SPO sandwiched between the primary driving electrodes PD. The direction of action of the force periodically changes.

The secondary pickoff electrode SPO adjacent to the pair of the primary driving electrode PD and the primary pickoff electrode PPO is at a location apart from the electrodes PD, PPO by 45 degrees in the circumferential direction.

Thus, as shown in each of (a) and (b) of FIG. 7, the portion of the secondary pickoff electrode SPO formed in the plane of the resonator 20 deforms, in a plane parallel with the front surface of the resonator 20, symmetrically with respect to a virtual center axis which is an axis passing through the center, centered in the circumferential direction, of the portion of the secondary pickoff electrode SPO and extending in the radial direction. That is, in a case where one end portion is displaced inward in the radial direction from a location before operation, the other end portion is displaced outward in the radial direction. In a case where one end portion is displaced outward in the radial direction from the location before operation, the other end portion is displaced inward in the radial direction. Needless to say, such deformation is repeated in a predetermined cycle.

Note that in description below, a portion of the secondary pickoff electrode SPO on the left side of the plane of paper with respect to the center axis will be sometimes referred to as an SPO(L) and a portion on the right side of the plane of paper will be sometimes referred to as an SPO(R).

The secondary pickoff electrode SPO illustrated in (a) of FIG. 7 is displaced symmetrically to the secondary pickoff electrode SPO illustrated in (b) in terms of time. That is, in the example shown in (a), as time advances from a time point t0 before operation to a time point t1, the SPO(L) is displaced outward in the radial direction, and the SPO(R) displaces inward in the radial direction. On the other hand, in the example shown in (b), the SPO(L) is displaced inward in the radial direction, and the SPO(R) is displaced outward in the radial direction. At a time point t2, the SPO returns to the same location as that at the time point t0 in both cases shown in (a) and (b). As time advances to a time point t3, the SPO(L) is displaced inward in the radial direction and the SPO(R) is displaced outward in the radial direction in the example shown in (a). On the other hand, in the example shown in (b), the SPO(L) is displaced outward in the radial direction, and the SPO(R) is displaced inward in the radial direction. As time further advances to a time point t4, the SPO returns to the same location as that at the time point t0 in both cases shown in (a) and (b).

Each of the secondary pickoff electrode SPO illustrated in (a) and (b) of FIG. 7 and the resonator 20 located immediately therebelow periodically repeatedly deform as described above. At the resonator 20 immediately below the secondary pickoff electrode SPO, the moving velocity is the maximum or minimum at a location where a deformation amount is zero, and therefore, the amplitude of the voltage generated at the secondary pickoff electrode SPO is also the maximum or minimum. The moving velocity is zero at a location where the deformation amount is the maximum or minimum, and therefore, the amplitude of the voltage generated at the secondary pickoff electrode SPO is also zero.

As described above, deformation of the secondary pickoff electrode SPO is such that there is a slight difference in the deformation amount between the deformation outward and the deformation inward in the radial direction, and accordingly, the voltage generated at the secondary pickoff electrode SPO has a distortion component superimposed on a fundamental sinusoidal wave (hereinafter sometimes referred to as a fundamental wave signal). This distortion component is equivalent to a difference (hereinafter, a differential signal) between the actual output signal from the secondary pickoff electrode SPO and the fundamental wave signal.

FIG. 8 illustrates the actual output signal from the secondary pickoff electrode SPO and the fundamental wave signal and the differential signal included therein. Moreover, t0 to t4 illustrated in FIG. 8 correspond to the time points t0 to t4 described with reference to FIG. 7.

Focusing on one secondary pickoff electrode SPO, it is assumed that the direction of the fundamental wave is opposite between the SPO(L) and the SPO(R), i.e., when one of the SPO(L) or the SPO(R) has a positive value, the other one of the SPO(L) or the SPO(R) has a negative value. In the case of an ideal output signal with a differential signal of zero, one SPO signal, which is a combination of the SPO(L) and SPO(R) signals, is zero. However, due to the above-described superimposed distortion component, the direction of the differential signal with respect to the fundamental wave is the same direction between the SPO(L) and SPO(R), and therefore, the positive and negative values with respect to the fundamental wave change with a double frequency. Taking this fact into consideration, it can be said that a signal having a frequency twice as high as the frequency of the fundamental wave signal, i.e., the frequency of the AC current Ip, is generated at one secondary pickoff electrode SPO. Hereinafter, such a signal will be sometimes referred to as a second harmonic component.

The second harmonic component is an error component in the output signal from the secondary pickoff electrode SPO, and therefore, may be a bias component for an angular velocity detection value. This leads to a problem in a case where the angular velocity needs to be obtained with a high accuracy.

The second harmonic component is, as shown in FIG. 8, formed such that the differential signals generated at the SPO(L) and the SPO(R) and having the same phase are superimposed on each other, and therefore, the amplitude thereof is also approximately doubled. This provides a greater influence on the angular velocity detection value.

Two secondary pickoff electrodes SPO at locations apart from each other by 90 degrees in the circumferential direction displace symmetrically in terms of time, as shown in FIG. 7. The second harmonic components included in the output signals from the secondary pickoff electrodes SPO have the opposite phases. Thus, the output signals from two secondary pickoff electrodes SPO are added up so that the second harmonic components can be canceled out to almost zero.

In the vibrating-type gyroscope element 100 described in the present embodiment, four secondary pickoff electrodes SPO are arranged at locations apart from each other by 90 degrees in the circumferential direction, as shown in FIG. 1. The voltages generated at four secondary pickoff electrodes SPO are added up and are output as the output signal, and therefore, the output signal eventually input to the secondary detector 230 from the secondary pickoff electrodes SPO has almost no second harmonic component and the error component is reduced.

As described above, the vibrating-type gyroscope element 100 according to the present embodiment includes at least the fixed part 10, the resonator 20, the support parts 30 connecting the resonator 20 to the fixed part 10 and vibratably supporting the resonator 20, and the electrodes 40a to 40p provided circumferentially in the plane of the resonator 20.

When the resonator 20 has a cos 2θ mode of vibration, the electrodes 40a to 40p are arranged at equiangular intervals in the outer circumferential direction of the resonator 20, which are intervals of 45 degrees for the eight orientations in this case.

These 16 electrodes 40a to 40p include the primary driving electrodes PD that excite the first order vibration of the resonator 20 in the cos 2θ mode and the primary pickoff electrodes PPO that detect the first order vibration. Further, the electrodes 40a to 40p include the secondary pickoff electrodes SPO that detect the second order vibration generated when the angular velocity is provided to the resonator 20 and the secondary driving electrodes SD that drive the resonator 20 in such a way as to cancel the second order vibration.

The primary pickoff electrode PPO is arranged in the same orientation as that of the primary driving electrode PD, and the secondary driving electrode SD is arranged in the same orientation as that of the secondary pickoff electrode SPO. The pairs of the primary driving electrode PD and the primary pickoff electrode PPO and the pairs of the secondary driving electrode SD and the secondary pickoff electrode SPO are alternately arranged at eight orientations.

The vibrating-type gyroscope element 100 further includes the magnetic field applier 60 that applies the magnetic field to 16 electrodes 40a to 40p in the direction crossing the front surface of the resonator 20, which is the axial direction in this case.

With this configuration of the vibrating-type gyroscope element 100, it becomes possible that the bias component included in the output signal from the vibrating-type gyroscope element 100 can be reduced in a case where the angular velocity sensor 1000 is so configured that an operation of switching over the primary pairs and the secondary pairs is performed therein. This will be further described with reference to the drawings.

Figure 9:
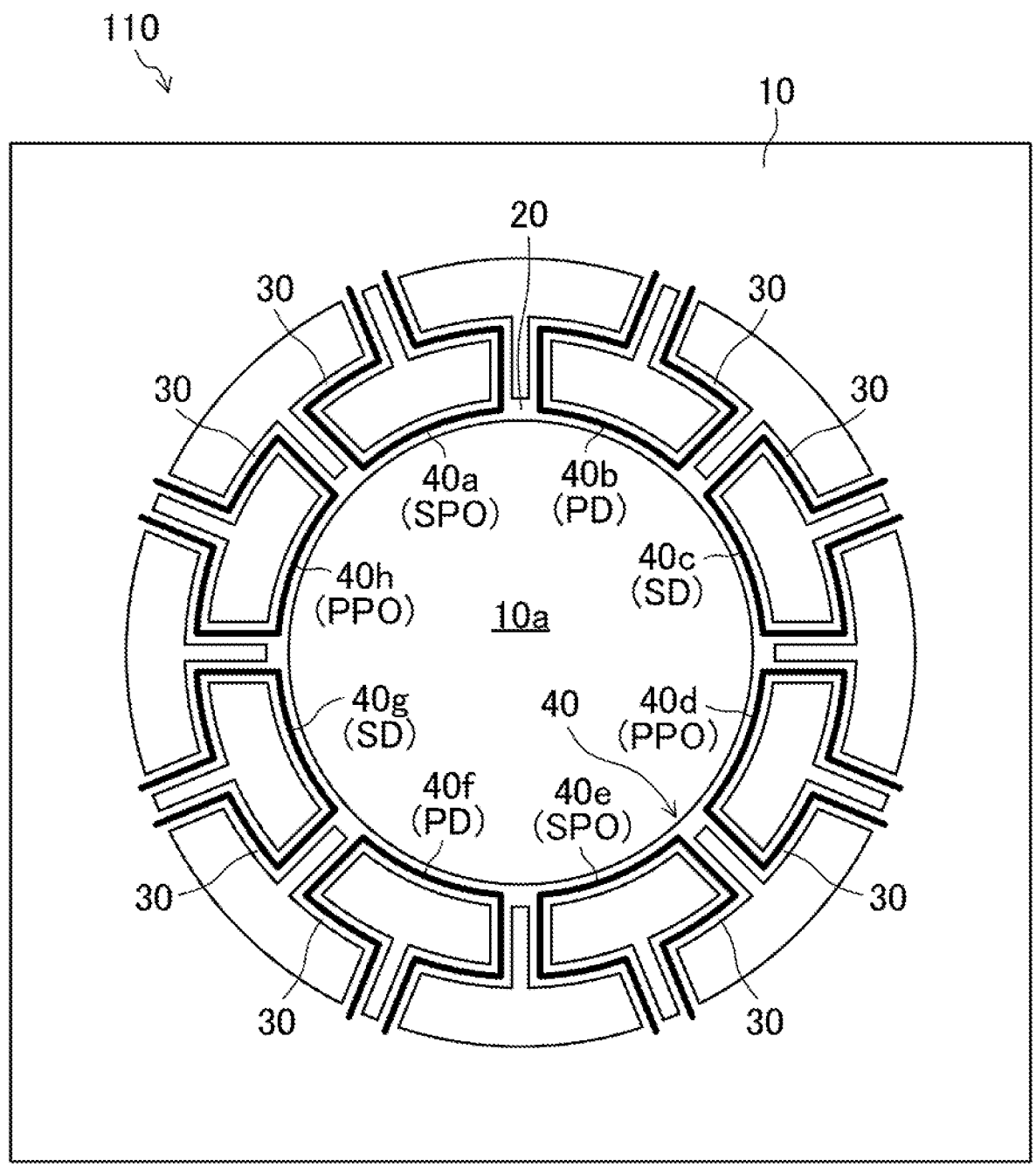
FIG. 9 is a plan view showing electrode arrangement for comparison.

FIG. 9 shows arrangement of electrodes 40 for comparison. A vibrating-type gyroscope element 110 shown in FIG. 9 has, for example, a configuration similar to that disclosed in Japanese Patent No. 5410518.

In the vibrating-type gyroscope element 110 shown in FIG. 9, electrodes 40a to 40h are each arranged on eight support parts 30. Primary driving electrodes PD, secondary driving electrodes SD, primary pickoff electrodes PPO, and secondary pickoff electrodes SPO are arranged at eight orientations in this order in the clockwise direction in the circumferential direction. The electrodes PD, SD, PPO, SPO are provided two each, and the electrodes of the same type are arranged at locations apart from each other by 180 degrees in the circumferential direction.

In the vibrating-type gyroscope elements 100, 110, force acts on each of the electrodes 40a to 40p during operation, and a mechanical motion axis is virtually assumed accordingly. Assuming that the axis for the primary driving electrode PD is, for example, a PD axis, a predetermined angular relationship is unambiguously set, according to a relationship of arrangement of the electrodes, among the PD axis and an SD axis, a PPO axis, and a SPO axis which are motion axes for the secondary driving electrode SD, the primary pickoff electrode PPO, and the secondary pickoff electrode SPO.

The resonator 20 also has virtual motion axes for the first order vibration and the second order vibration. Ideally, the motion axis for the first order vibration and the PD axis overlap with each other. In this case, the motion axis for the second order vibration and the SD axis also overlap with each other.

However, as described above, usually in the vibrating-type gyroscope element 110, e.g., angular offset among the electrodes 40a to 40p or uneven magnetic field application is caused. Due to these factors, angular offset is caused between the motion axis for the first order vibration and the PD axis. Further, the angular offset among the electrodes 40a to 40p also leads to angular offset between the PD axis and the SD axis. Similarly, the angular offset among the electrodes 40a to 40p also leads to angular offset between each of the PPO axis and the SPO axis and the PD axis. The above-described bias component is generated due to such angular offset.

The inventors of the present application have found that a noise component due to the angular offset between the PD axis and the motion axes for the electrodes SD, PPO, SPO other than the PD axis is superimposed on the bias component and is not canceled out even by, as disclosed in Japanese Unexamined Patent Publication No. 2009-115559, operating the angular velocity sensor 1000 with the primary pairs and secondary pairs thereof switched over to eliminate a difference in an output signal.

Thus, the inventors of the present application have noted an importance of the relationship of arrangement of the electrodes PD, SD, PPO, SPO, thereby finding that the angular offset between the PD axis and each of the SD axis, the PPO axis, and the SPO axis which are the motion axes other than the PD axis can be reduced by arranging the electrodes PD, SD, PPO, SPO at the locations as shown in FIG. 1. With this configuration, the elimination of the difference in the output signal by an operation of switching over the primary pairs and the secondary pairs can substantially cancel out the entire bias component.

Two electrodes 40 are provided from a support part 30 to the resonator 20 in such a way as to extend in parallel with each other with the space kept therebetween. One electrode 40 provided on one support part 30 is the primary driving electrode PD, and the other electrode 40 provided thereon is the primary pickoff electrode PPO. One electrode 40 provided on the other support part 30 is the secondary driving electrode SD, and the other electrode 40 provided thereon is the secondary pickoff electrode SPO.

The electrodes 40a to 40p are arranged respectively on eight support parts 30 as described above so that the primary pickoff electrode PPO and the primary driving electrode PD can be easily arranged in the same orientation. In addition, the secondary driving electrode SD and the secondary pickoff electrode SPO can be easily arranged in the same orientation. With this configuration, the angular offset between the PD axis and each of the SD axis, the PPO axis, and the SPO axis which are the motion axes other than the PD axis can be reduced, and therefore, the bias component included in the output signal from the vibrating-type gyroscope element 100 can be significantly reduced. Moreover, this configuration can suppress an unnecessary increase in the size of the vibrating-type gyroscope element 100.

In view of the above-described point, it can be said that the mechanical motion axis is virtually assumed for each of the electrodes 40a to 40p. Thus, the arrangement orientations of the electrodes 40a to 40p can be also said to be such orientations that the virtual motion axes (hereinafter sometimes referred to as the axis of the electrode 40) are arranged at equiangular intervals in the outer circumferential direction of the resonator 20.

Four secondary pickoff electrodes SPO may be preferably connected in series.

With this configuration, a greater voltage signal can be taken for detecting the second order vibration. Accordingly, a high S/N ratio of the output signal from the secondary detector 230 can be obtained, thereby making it possible to enhance the accuracy of detection of the angular velocity calculated by the computing unit 240.

For a similar reason, four primary pickoff electrodes PPO may be connected in series, preferably.

Four secondary pickoff electrodes SPO may be arranged at the locations apart from each other by 90 degrees in the circumferential direction, preferably. With this configuration, the second harmonic component, which is the error component included in the output signal from the secondary pickoff electrode SPO can be reduced.

It is preferable that the support part 30 on which the electrode 40 is arranged include the first leg 31 having the first to third portions 31a, 31c, 31e and the second leg 32 having the first to third portions 32a, 32c, 32e. It is more preferable that the first leg 31 and the second leg 32 be arranged symmetrically with respect to the virtual line passing through the center of the resonator 20 and extending between the third portions 31e, 32e.

This configuration of the support part 30 makes it possible that, when the first order vibration of the resonator 20 is generated, the resonator 20 can be supported with no great influence on the vibration. The support parts 30 are provided at equiangular intervals in the circumferential direction and the first leg 31 and the second leg 32 are provided symmetrically with respect to the above-described virtual line, and therefore, the resonator 20 can be connected to the fixed part 10 with equal balance. Thus, the first order vibration of the resonator 20 can be stably generated.

According to the vibrating-type gyroscope element 100 of the present embodiment, a crosstalk voltage included in the voltage generated at the secondary pickoff electrode SPO can be reduced. This will be further described herein.

In a case where the primary driving electrode PD and the secondary pickoff electrode SPO are close to each other, mutual induction is caused at the secondary pickoff electrode SPO due to the AC current flowing in the primary driving electrode PD, and as a result, the crosstalk voltage is induced. Such a crosstalk voltage is also superimposed on the vibrating-type gyroscope element 100, thereby being an error component.

On the other hand, in the vibrating-type gyroscope element 100 of the present embodiment, a pair of the primary driving electrode PD and the primary pickoff electrode PPO is arranged on each side of a pair of the secondary driving electrode SD and the secondary pickoff electrode SPO, as shown in FIG. 1.

As described above, in order to excite the first order vibration of the resonator 20 in the cos 2θ mode, the primary driving electrodes PD in which the AC current Ip flows in the clockwise direction and the primary driving electrodes PD in which the AC current Ip flows in the counterclockwise direction are alternately arranged.

In this case, crosstalk voltages being of the same level but different from each other in the direction of the electromotive force are induced between respective ones of primary driving electrodes PD and the secondary pickoff electrode SPO arranged therebetween, and as a result, are canceled out to almost zero. Since the crosstalk voltage is reduced as described above, the accuracy of detection of the angular velocity is enhanced.

As shown in FIG. 3, the location where the secondary driving electrode SD is arranged between the primary driving electrode PD and the secondary pickoff electrode SPO is at a portion where the primary driving electrode PD and the secondary pickoff electrode SPO are the closest to each other, i.e., the first portions 31a, 32a of the support parts 30. With this configuration, a mutual inductance between the primary driving electrode PD and the secondary pickoff electrode SPO can be decreased, and the level of the crosstalk voltage can be reduced.

Note that also in configurations described later in second to fourth modifications, the crosstalk voltage included in the voltage generated at the secondary pickoff electrode SPO can be further reduced as compared to the configuration shown in FIG. 9 and the accuracy of detection of the angular velocity can be more enhanced accordingly.

Note that depending on the arrangement orientation of the primary driving electrode PD and the number of primary driving electrodes PD, the resonator 20 may have a cos Nθ (N is a natural number of two or more) mode of vibration. In this case, the arrangement orientations of the axes of the electrodes 40 are 4N orientations.

That is, in the vibrating-type gyroscope element 100 of the present embodiment, the support parts 30 and the electrodes 40 are arranged in such 4N orientations that the axes of the electrodes 40 are arranged at equiangular intervals in the outer circumferential direction of the resonator 20 in a case where the resonator 20 has a cos Nθ mode of vibration.

One support part 30 is arranged at a location apart from another support part 30 by (360/4N) degrees. That is, a certain pair of the primary driving electrode PD and the primary pickoff electrode PPO and a pair, which is adjacent to the certain pair, of the secondary driving electrode SD and the secondary pickoff electrode SPO are arranged at locations apart from each other by (360/4N) degrees.

In a preferred embodiment, the plurality of secondary pickoff electrodes SPO included in the vibrating-type gyroscope element 100 are arranged at locations apart from each other by (360/2N+360×(M/N)) degrees in the circumferential direction. Here, M is an integer, and satisfies a relationship of 0≤M≤N−1. With this configuration, the second harmonic component, which is the error component included in the output signal from the secondary pickoff electrode SPO can be reduced.

The angular velocity sensor 1000 of the present embodiment includes at least the vibrating-type gyroscope element 100, the primary AC power supply 200 that applies the AC current with the predetermined frequency to the primary driving electrodes PD, the primary detector 210 that detects the voltage signals generated at the primary pickoff electrodes PPO, the secondary AC power supply 220 that applies the AC current to the secondary driving electrodes SD, the secondary detector 230 that detects the voltage signals generated at the secondary pickoff electrodes SPO, and the computing unit 240 that calculates the angular velocity based on the output signal from the secondary AC power supply 220.

The angular velocity sensor 1000 further includes the switcher 250 that switches over the pairs of the primary driving electrode PD and the primary pickoff electrode PPO with the pairs of the secondary driving electrode SD and the secondary pickoff electrode SPO at the predetermined timing, so as to exchange their operations. The computing unit 240 calculates the angular velocity based on the output signals from the secondary AC power supply 220 before and after the switching-over operation.

According to the angular velocity sensor 1000 of the present embodiment, the bias component included in the output signal from the vibrating-type gyroscope element 100 can be reduced, and the accuracy of detection of the angular velocity can be enhanced.

According to the present embodiment, the voltage generated at the primary pickoff electrode PPO is detected by the primary detector 210, and the output signal from the primary detector 210 is fed back to the primary AC power supply 200. With this configuration, the first order vibration generated at the resonator 20 can be stabilized.

The voltage generated at the secondary pickoff electrode SPO is detected by the secondary detector 230, and based on the output signal from the secondary detector 230, the output of the secondary AC power supply 220 is controlled such that the second order vibration generated at the resonator 20 is canceled. With this configuration, the vibration state of the resonator 20 can be stabilized. Also, with this configuration, the noise component included in the output signal from the secondary AC power supply 220 can be reduced, and the accuracy of detection of the angular velocity can be enhanced.

Note that in description above, when the angular velocity sensor 1000 is operated, the primary driving electrode PD and the secondary driving electrode SD are switched over at the predetermined timing so as to exchange their operations, and the primary pickoff electrode PPO and the secondary pickoff electrode SPO are switched over at the predetermined timing so as to exchange their operations. However, the combination of the electrodes 40 to be switched over is not limited to the above. When the angular velocity sensor 1000 is operated, the primary driving electrode PD and the secondary pickoff electrode SPO may be switched over at the predetermined timing so as to exchange their operations, and the primary pickoff electrode PPO and the secondary driving electrode SD may be switched over at the predetermined timing so as to exchange their operations.

<First Modification>

Figure 10:
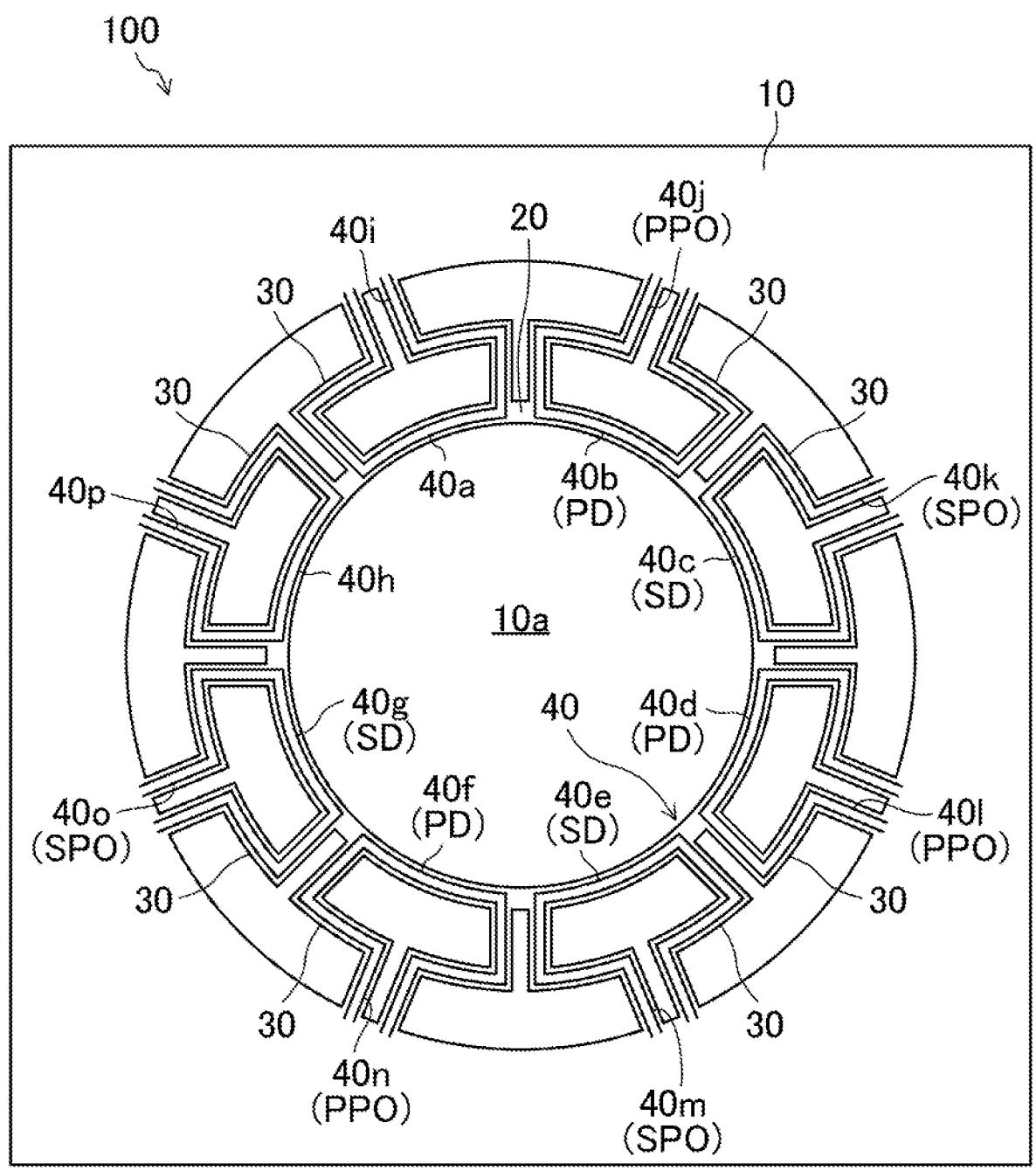
FIG. 10 is a plan view showing electrode arrangement according to a first modification.

FIG. 10 is a plan view showing electrode arrangement according to the present modification. Note that in FIG. 10 and each figure thereafter, the like reference numerals are used to represent like elements similar to those of the first embodiment and detailed description thereof will not be repeated.

The configuration shown in FIG. 10 is different from the configuration shown in the first embodiment in that three pairs of the primary driving electrode PD and the primary pickoff electrode PPO and three pairs of the secondary driving electrode SD and the secondary pickoff electrode SPO are provided.

In the configuration shown in FIG. 10, the pairs of the primary driving electrode PD and the primary pickoff electrode PPO and the pairs of the secondary driving electrode SD and the secondary pickoff electrode SPO are sequentially and alternately arranged in the circumferential direction.

Note that regarding the electrodes 40*a*, 40*h*, 40*i*, 40*p*, the type of electrode 40, e.g., whether the electrode 40 is the primary driving electrode PD or the secondary pickoff electrode SPO, is not clearly described. The electrodes 40 whose type is not clearly described as described above are so-called dummy electrodes provided for equalizing the balance of the mass of the resonator 20, and do not contribute to detection of the first order vibration and the second order vibration of the resonator 20. Similarly, in each figure hereinafter, the electrodes 40 whose type is not clearly described are dummy electrodes.

The vibrating-type gyroscope element 100 described in the present modification provides advantages similar to those of the configuration described in the first embodiment. That is, this configuration makes it possible that the bias component included in the output signal from the vibrating-type gyroscope element 100 can be reduced in a case where an operation of switching over the primary pairs and the secondary pairs is performed in the angular velocity sensor 1000.

According to the angular velocity sensor 1000 on which the vibrating-type gyroscope element 100 of the present modification is mounted, the accuracy of detection of the angular velocity is enhanced as in the first embodiment.

<Second Modification>

Figure 11:
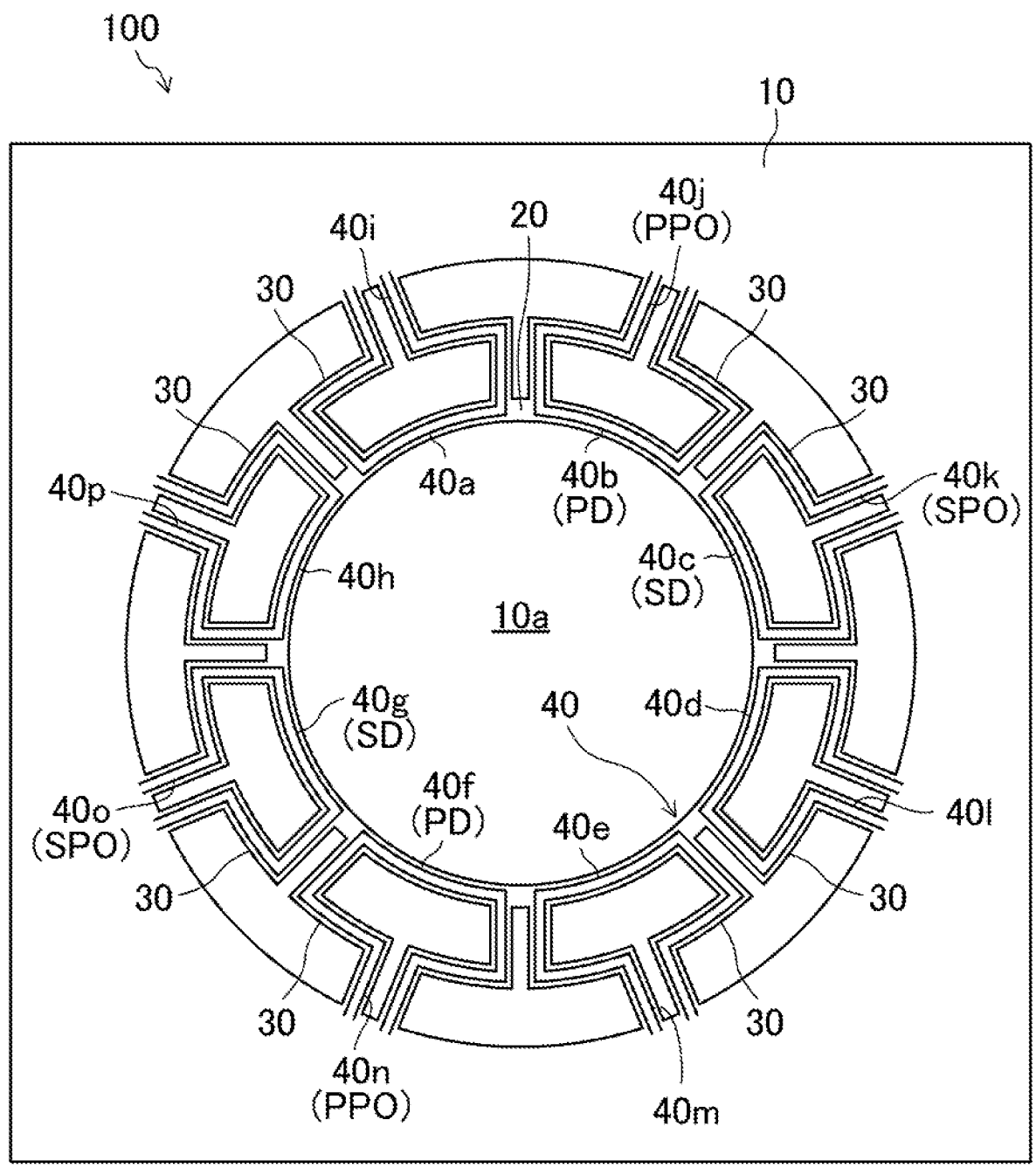
FIG. 11 is a plan view showing electrode arrangement according to a second modification.

FIG. 11 shows a plan view of electrode arrangement according to the present modification, and is different from the configuration shown in the first embodiment in that two pairs of the primary driving electrode PD and the primary pickoff electrode PPO and two pairs of the secondary driving electrode SD and the secondary pickoff electrode SPO are provided.

In the configuration shown in FIG. 11, one pair of the primary driving electrode PD and the primary pickoff electrode PPO and one pair of the secondary driving electrode SD and the secondary pickoff electrode SPO are arranged at locations apart from each other by (360/4N) degrees in the circumferential direction, which are locations apart from each other by 45 degrees in this case. Further, two pairs of the primary driving electrode PD and the primary pickoff electrode PPO are arranged at locations apart from each other by (360/N) degrees in the circumferential direction, which are locations apart from each other by 180 degrees in this case. Similarly, two pairs of the secondary driving electrode SD and the secondary pickoff electrode SPO are arranged at locations apart from each other by 180 degrees in the circumferential direction.

The vibrating-type gyroscope element 100 described in the present modification provides advantages similar to those of the configuration described in the first embodiment. That is, this configuration makes it possible that the bias component included in the output signal from the vibrating-type gyroscope element 100 can be reduced in a case where an operation of switching over the primary pairs and the secondary pairs is performed in the angular velocity sensor 1000.

According to the angular velocity sensor 1000 on which the vibrating-type gyroscope element 100 of the present modification is mounted, the accuracy of detection of the angular velocity is enhanced as in the first embodiment.

<Third Modification>

Figure 12:
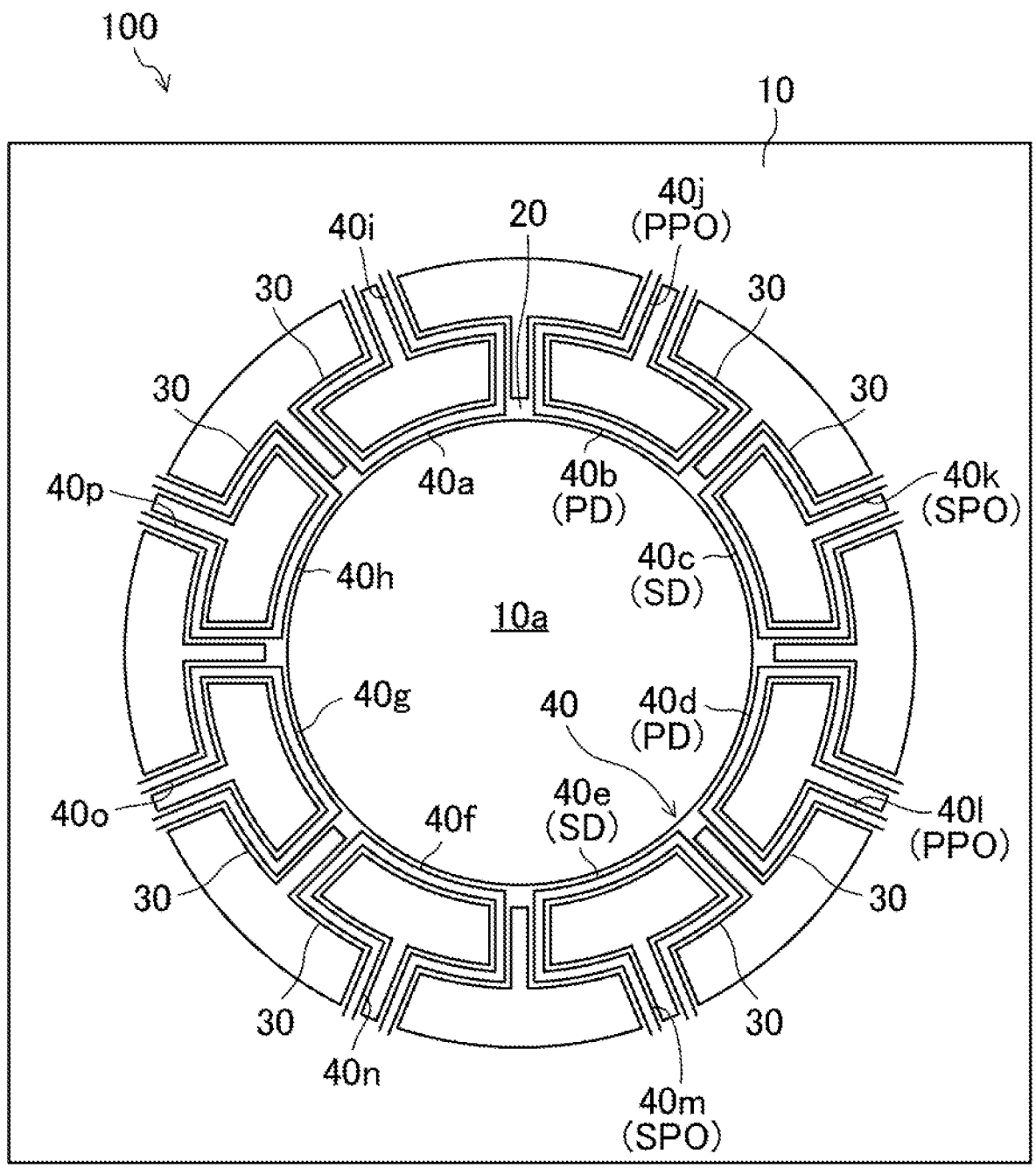
FIG. 12 is a plan view showing electrode arrangement according to a third modification.

FIG. 12 shows a plan view of electrode arrangement according to the present modification, and is different from the configuration shown in the first embodiment in that two pairs of the primary driving electrode PD and the primary pickoff electrode PPO and two pairs of the secondary driving electrode SD and the secondary pickoff electrode SPO are provided.

In the configuration shown in FIG. 12, one pair of the primary driving electrode PD and the primary pickoff electrode PPO and one pair of the secondary driving electrode SD and the secondary pickoff electrode SPO are arranged at locations apart from each other by (360/4N) degrees in the circumferential direction, which are locations apart from each other by 45 degrees in this case. Further, two pairs of the primary driving electrode PD and the primary pickoff electrode PPO are arranged at locations apart from each other by (360/2N+360×(M/N)) degrees in the circumferential direction. In this case, M=0 and N=2, and two pairs of the primary driving electrode PD and the primary pickoff electrode PPO are arranged at locations apart from each other by 90 degrees in the circumferential direction. Similarly, two pairs of the secondary driving electrode SD and the secondary pickoff electrode SPO are arranged at locations apart from each other by 90 degrees in the circumferential direction.

The vibrating-type gyroscope element 100 described in the present modification provides advantages similar to those of the configuration described in the first embodiment. That is, this configuration makes it possible that the bias component included in the output signal from the vibrating-type gyroscope element 100 can be reduced in a case where an operation of switching over the primary pairs and the secondary pairs is performed in the angular velocity sensor 1000.

In the present modification, two secondary pickoff electrodes SPO are arranged at locations apart from each other by 90 degrees in the circumferential direction, i.e., locations perpendicular to each other. Thus, as described in the first embodiment, the second harmonic component, which is the error component included in the output signal from the secondary pickoff electrode SPO can be reduced.

According to the angular velocity sensor 1000 on which the vibrating-type gyroscope element 100 of the present modification is mounted, the accuracy of detection of the angular velocity is enhanced as in the first embodiment.

<Fourth Modification>

Figure 13:
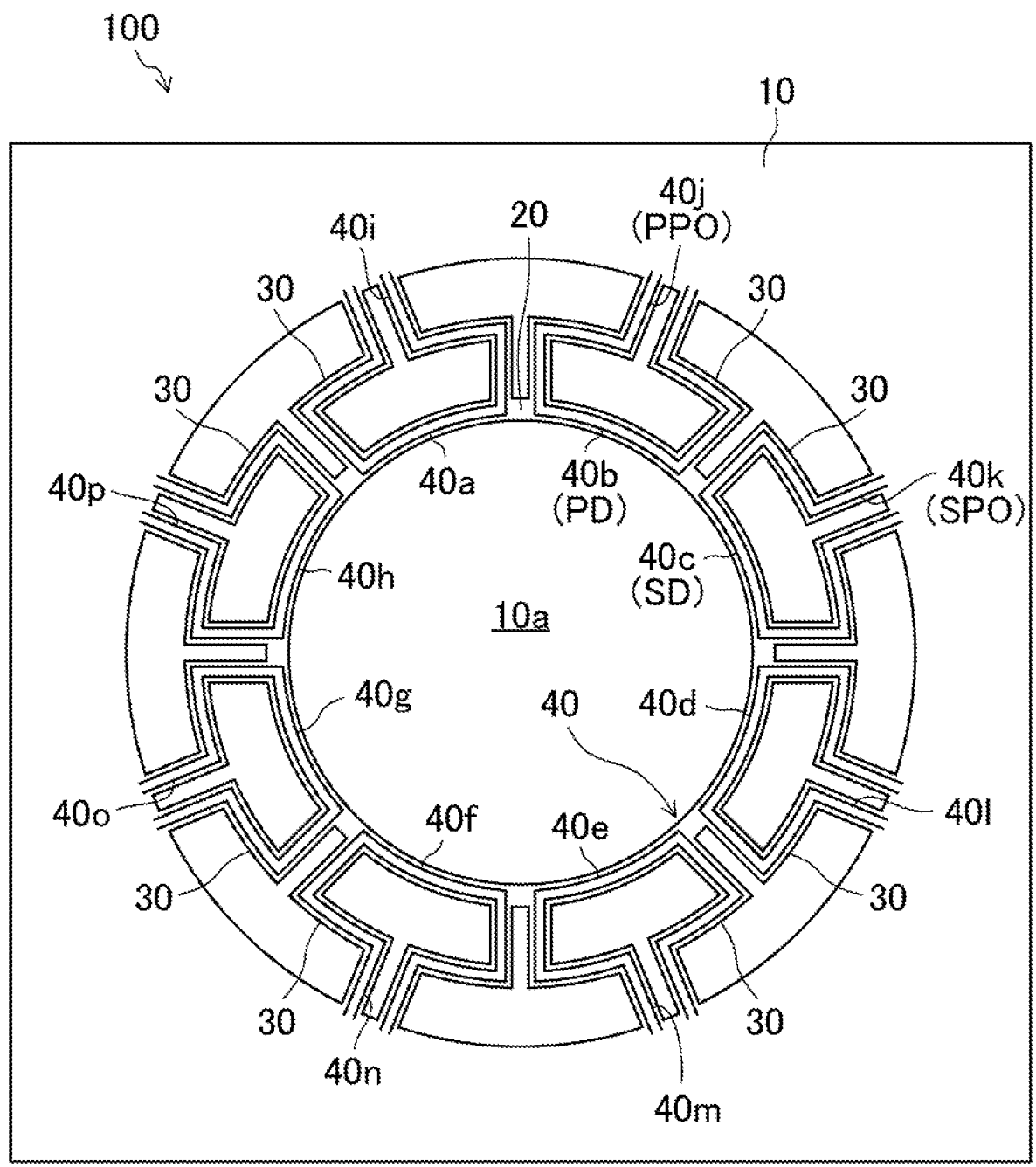
FIG. 13 is a plan view showing electrode arrangement according to a fourth modification.

FIG. 13 shows a plan view of electrode arrangement according to the present modification, and is different from the configuration shown in the first embodiment in that one pair of the primary driving electrode PD and the primary pickoff electrode PPO and one pair of the secondary driving electrode SD and the secondary pickoff electrode SPO are provided.

In the configuration shown in FIG. 13, one pair of the primary driving electrode PD and the primary pickoff electrode PPO and one pair of the secondary driving electrode SD and the secondary pickoff electrode SPO are arranged at locations apart from each other by (360/4N) degrees in the circumferential direction, which are locations apart from each other by 45 degrees in this case.

The vibrating-type gyroscope element 100 described in the present modification provides advantages similar to those of the configuration described in the first embodiment. That is, this configuration makes it possible that the bias component included in the output signal from the vibrating-type gyroscope element 100 can be reduced in a case where an operation of switching over the primary pairs and the secondary pairs is performed in the angular velocity sensor 1000.

According to the angular velocity sensor 1000 on which the vibrating-type gyroscope element 100 of the present modification is mounted, the accuracy of detection of the angular velocity is enhanced as in the first embodiment.

Second Embodiment

Figure 14:
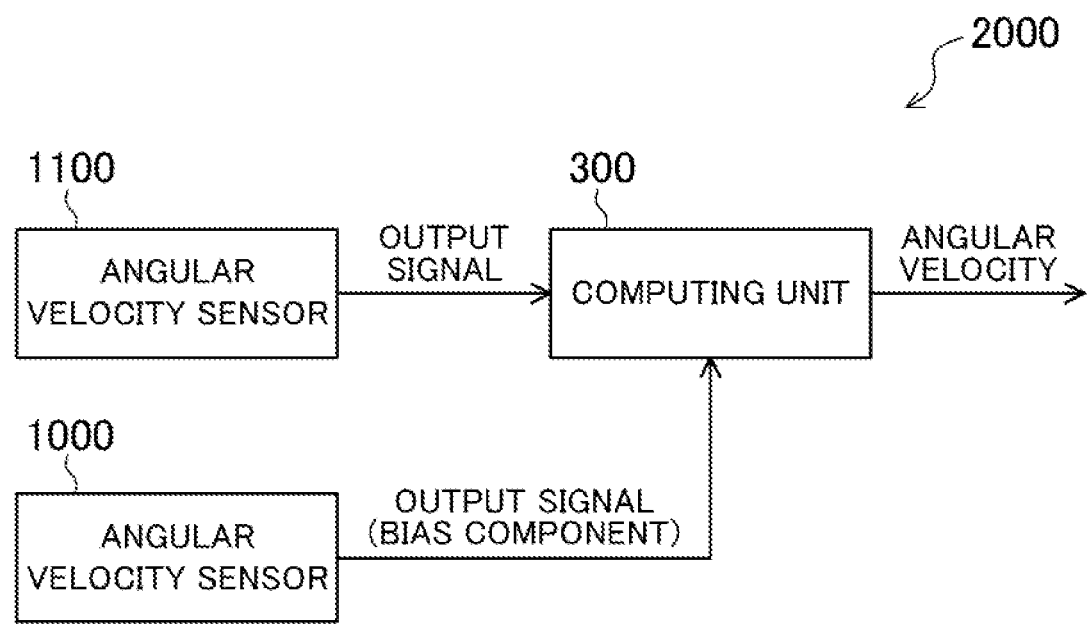
FIG. 14 is a schematic configuration diagram of an angular velocity sensor according to a second embodiment.

FIG. 14 shows a schematic configuration diagram of an angular velocity sensor according to the present embodiment, and this angular velocity sensor 2000 includes a pair of angular velocity sensors 1000, 1100 and a computing unit 300.

The pair of angular velocity sensors 1000, 1100 has vibrating-type gyroscope elements 100 having the same configuration and size. The vibrating-type gyroscope element 100 has the same structure as that described in the first embodiment. Further, the configuration of a unit that processes an electric signal is similar to that shown in FIG. 4, and two angular velocity sensors 1000, 1100 have the same structure and properties of each unit. Two angular velocity sensors 1000, 1100, particularly the vibrating-type gyroscope elements 100 provided therein, are provided at locations close to each other, such as locations on the same substrate. Alternatively, two angular velocity sensors 1000, 1100 are arranged in the same package or the same case even in a case where these sensors 1000, 1100 are provided on different substrates.

On the other hand, the pair of angular velocity sensors 1000, 1100 is different from each other in an operation method. The angular velocity sensor 1000 is operated in such a way that primary pairs and secondary pairs are switched over in a predetermined cycle. That is, the angular velocity sensor 1000 operates in a manner similar to that of the angular velocity sensor 1000 described in the first embodiment. Note that in the angular velocity sensor 1000, the cycle of the switching-over operation is constant.

On the other hand, the angular velocity sensor 1100 is operated with primary pairs and secondary pairs fixed. That is, an operation of switching over the primary pairs and the secondary pairs is not performed therein. Thus, a switcher 250 and switches 260 shown in FIG. 4 may be omitted in the angular velocity sensor 1100.

An output signal from the angular velocity sensor 1000 and an output signal from the angular velocity sensor 1100 are input to the computing unit 300.

The computing unit 300 corrects the output signal from the angular velocity sensor 1100 based on the output signal from the angular velocity sensor 1000, and calculates an angular velocity based on the corrected signal. More specifically, a bias component may be extracted from the output signal from the angular velocity sensor 1000, and the extracted bias component may be subtracted from the output signal from the angular velocity sensor 1100. The bias component may be obtained from a value obtained by addition of the output signal from the angular velocity sensor 1000 in an operation of switching over the primary pairs and the secondary pairs. As an alternative, the bias component included in the output signal from the angular velocity sensor 1100 may be calculated by comparison between the output signal from the angular velocity sensor 1000, for which the bias component has been canceled in advance as described in the first embodiment, and the output signal from the angular velocity sensor 1100, thereby performing a correction of subtracting such a bias component.

In a case where the angular velocity sensor 1000 is mounted on a moving object, a timing of switching over the primary pairs and the secondary pairs would not be properly settable in the angular velocity sensor 1000 described in the first embodiment in some cases. Depending on an operating state of a device on which the angular velocity sensor 1000 is mounted, the angular velocity sensor 1000 would need to constantly output the angular velocity in some cases. In these cases, there is a probability that the bias component cannot be properly canceled and the accuracy of detection of the angular velocity is degraded.

On the other hand, according to the present embodiment, the output signal from the angular velocity sensor 1100 in which the switching-over operation is not performed is corrected using the output signal from the angular velocity sensor 1000 in which an operation of switching over the primary pairs and the secondary pairs is performed in a certain cycle.

With this configuration, the bias component included in the output signal from the angular velocity sensor 1100 can be grasped regardless of a mounting status of the angular velocity sensor 1100 and an operating status of the device, and the bias component can be properly reliably reduced. In addition, this can enhance the accuracy of detection of the angular velocity.

Note that FIG. 14 shows the example where the computing unit 300 is provided outside two angular velocity sensors 1000, 1100, but the function of the computing unit 300 may be incorporated into a computing unit 240 provided inside the angular velocity sensor 1000. With this configuration, the configuration of the angular velocity sensor 2000 is simplified. Further, this allows cost reductions for the angular velocity sensor 2000.

Note that in description above, when the angular velocity sensor 1000 is operated, the primary driving electrode PD and the secondary driving electrode SD are switched over in the predetermined cycle so as to exchange their operations, and the primary pickoff electrode PPO and the secondary pickoff electrode SPO are switched over in the predetermined cycle to exchange their operations. However, the combination of the electrodes 40 to be switched over is not limited to the above. When the angular velocity sensor 1000 is operated, the primary driving electrode PD and the secondary pickoff electrode SPO may be switched over in the predetermined cycle so as to exchange their operations, and the primary pickoff electrode PPO and the secondary driving electrode SD may be switched over in the predetermined cycle so as to exchange their operations.

Other Embodiments

The components described in the first and second embodiments and each modification may be combined to create a new embodiment. For example, in the angular velocity sensors 1000, 1100 described in the second embodiment, the vibrating-type gyroscope element 100 mounted thereon may be the vibrating-type gyroscope element 100 described in any of the first to fourth modifications. However, even in this case, two vibrating-type gyroscope elements 100 have the same structure and size in a preferred embodiment.

In the first and second embodiments and each modification, the electromagnetic vibrating-type gyroscope element 100 has been described as an example, but the present disclosure is not limited to above and the structure of the present disclosure is also applicable to, e.g., a piezoelectric vibrating-type gyroscope element.

Figure 15:
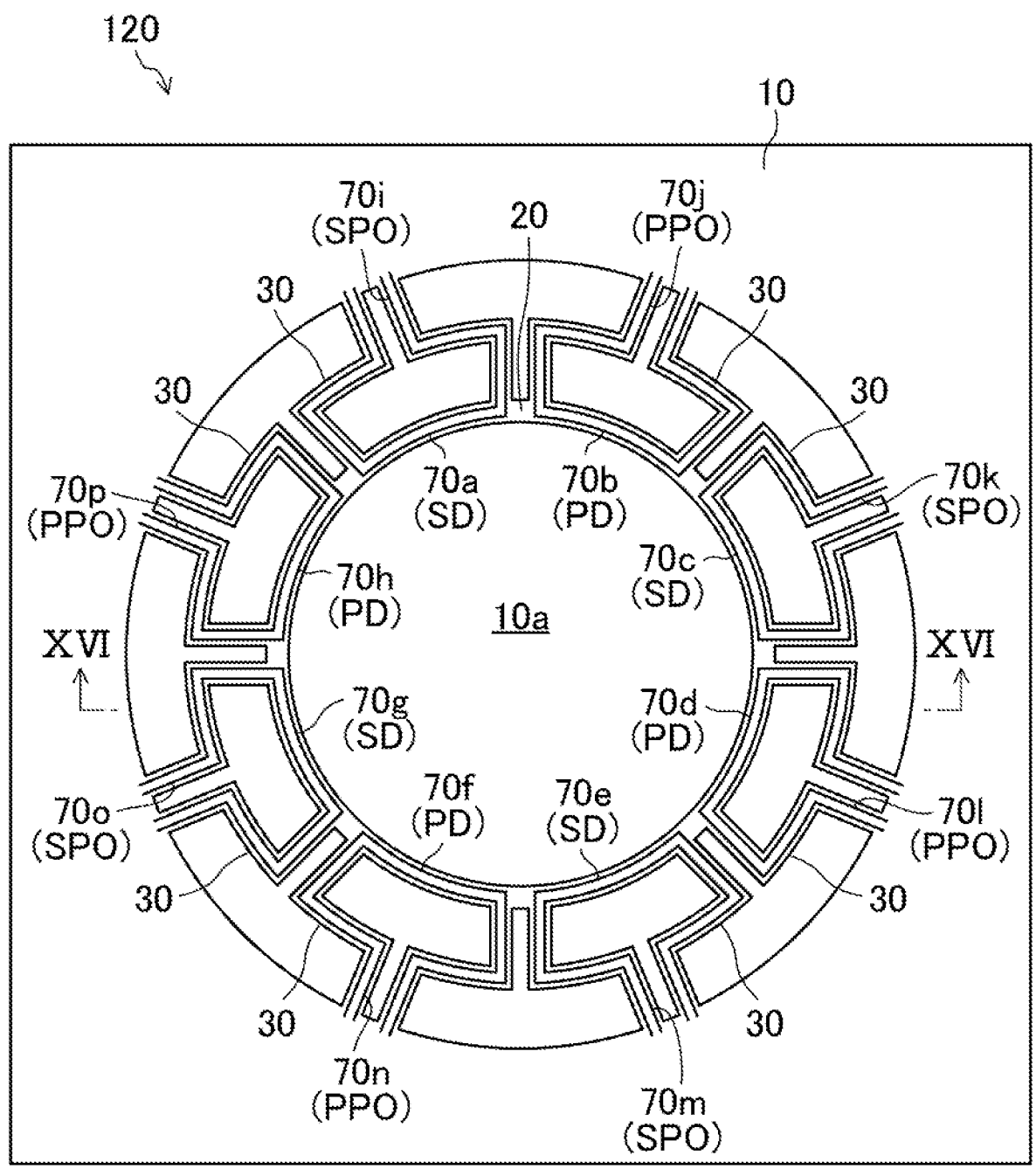
FIG. 15 is a plan view of a piezoelectric vibrating-type gyroscope element.

FIG. 15 shows a plan view of the piezoelectric vibrating-type gyroscope element, and FIG. 16 shows a cross-sectional view taken along line XVI-XVI in FIG. 15.

The vibrating-type gyroscope element 120 shown in FIG. 15 is similar to the vibrating-type gyroscope element 100 described in the first embodiment in the configurations and arrangement relationship of the fixed part 10, the resonator 20, and the support parts 30. A relationship of arrangement of the primary driving electrodes PD, the primary pickoff electrodes PPO, the secondary driving electrodes SD, and the secondary pickoff electrodes SPO is also similar to that of the first embodiment.

On the other hand, the vibrating-type gyroscope element 120 shown in FIGS. 15 and 16 is different from the vibrating-type gyroscope element 100 described in the first embodiment in that the magnetic field applier 60 is omitted and each of a plurality of electrodes 70a to 70p is a piezoelectric structure 80 in which a lower electrode layer 83, a piezoelectric body layer 82, and an upper electrode layer 81 are laminated on each other in this order.

The vibrating-type gyroscope element 120 shown in FIG. 15 operates as follows. First, when an AC voltage is applied to between the upper electrode layer 81 and the lower electrode layer 83 in the primary driving electrode PD, the piezoelectric body layer 82 periodically extends and contracts. The resonator 20 vibrates according to such extension and contraction. As in the first embodiment, the frequency of the AC voltage is adjusted to the resonance frequency of the resonator 20, and accordingly, the first order vibration of the resonator 20 in the cos 2θ mode is excited. Also, as in the first embodiment, the output signal from the primary detector 210 is fed back to the primary AC power supply 200, and the first order vibration is stabilized accordingly.

The secondary pickoff electrodes SPO and the piezoelectric body layers 82 included therein extend and contract according to vibration of the resonator 20. In response to such extension and contraction, an AC voltage is generated between the upper electrode layer 81 and the lower electrode layer 83 in the secondary pickoff electrode SPO.

When the angular velocity is generated at the resonator 20 and the second order vibration is generated accordingly, the voltage signal generated at the secondary pickoff electrode SPO is input to the secondary detector 230, and based on the output signal from the secondary detector 230, the output of the secondary AC power supply 220 is controlled such that the second order vibration is canceled. As in the first embodiment, the angular velocity is calculated by the computing unit 240 based on the output signal from the secondary AC power supply 220.

As in the first embodiment, it can be clearly understood that the bias component included in the voltage generated at the secondary pickoff electrode SPO can also be reduced in the vibrating-type gyroscope element 120 shown in FIG. 15. As in the first embodiment, the accuracy of detection of the angular velocity can also be enhanced in the angular velocity sensor 1000 on which the vibrating-type gyroscope element 120 is mounted.

Taking the example shown in FIG. 15 into consideration as well, it can be said that the primary AC power supply 200 described in the present Description applies the AC power with the predetermined frequency to the primary driving electrodes PD. The secondary AC power supply 220 applies the AC power to the secondary driving electrodes SD.

Note that the resonator 20 may only be required to be in such a shape that the first order vibration is excitable with the shape and the vibration state of the shape changes when the angular velocity is generated, and therefore the resonator 20 is not limited particularly to the circular ring shape. For example, the resonator 20 may be in a regular polygonal ring shape or a discoid shape. The resonator 20 may also be in a hemispherical shape.

The support part 30 may only be required to connect the resonator 20 to the fixed part 10 without interference with vibration of the resonator 20, and the shape thereof is not limited to that shown in FIGS. 1 and 3.

The first and second embodiments and each modification discuss the examples where the primary driving electrode PD and the primary pickoff electrode PPO are arranged in parallel with each other on the front surfaces of the resonator 20 and the support part 30. However, the present disclosure is not limited to these, and, for example, the primary driving electrode PD and the primary pickoff electrode PPO may be arranged in parallel with each other with a space kept therebetween in a thickness direction of the resonator 20 and the support part 30. More specifically, one of the primary driving electrode PD or the primary pickoff electrode PPO may be provided on the front surfaces of the resonator 20 and the support part 30, and the other one of the primary driving electrode PD or the primary pickoff electrode PPO may be provided on the back surfaces of the resonator 20 and the support part 30. Similarly, the secondary driving electrode SD and the secondary pickoff electrode SPO may be arranged in parallel with each other with a space kept therebetween in the thickness direction of the resonator 20 and the support part 30. That is, one of the secondary driving electrode SD or the secondary pickoff electrode SPO may be provided on the front surfaces of the resonator 20 and the support part 30, and the other one of the secondary driving electrode SD or the secondary pickoff electrode SPO may be provided on the back surfaces of the resonator 20 and the support part 30. In addition, these electrodes may be arranged inside the resonator 20 and the support part 30.

According to the vibrating-type gyroscope element of the present disclosure, the bias component included in the output signal can be reduced, and therefore, such a vibrating-type gyroscope element is usefully applicable to a highly accurate angular velocity sensor.

The invention claimed is:

1. A vibrating-type gyroscope element, comprising at least:
   a fixed part;
   a resonator with a ring shape or a discoid shape;
   a plurality of supports connecting the resonator to the fixed part and vibratably supporting the resonator; and
   a plurality of electrodes formed in a plane of one of opposite of the resonator or in planes of the opposite surfaces of the resonator,
   the resonator having a cos Nθ (where N is a natural number of two or more) mode of vibration,
   two of the plurality of electrodes being arranged in each of 4N orientations that axes of the plurality of electrodes are arranged at equiangular intervals in an outer circumferential direction of the resonator,
   the plurality of electrodes including:
      a primary driving electrode that excites first order vibration of the resonator in the cos Nθ mode;
      a primary pickoff electrode that detects the first order vibration;
         a secondary pickoff electrode that detects second order vibration of the resonator; and
      a secondary driving electrode that drives the resonator such that the second order vibration is canceled,
   the primary pickoff electrode being arranged in a same one of the 4N orientations as the orientation of the primary driving electrode, and
   the secondary driving electrode being arranged in a same on of the 4 N orientations as the orientation of the secondary pickoff electrode,
   wherein:
      the plurality of electrodes includes, in equal numbers, a set comprising the primary driving electrode and the primary pickoff electrode, and a set comprising the secondary driving electrode and the secondary pickoff electrode; and
      the plurality of electrodes is provided in such a way that:
         two electrodes extend in parallel with each other from a corresponding one of the plurality of supports to the resonator with a space kept between the two electrodes,
         one of the electrodes is provided on one of the plurality of supports and is the primary driving electrode, and the other one of the electrodes is the primary pickoff electrode, and
         one of the electrodes is provided on another of the plurality of supports and is the secondary driving electrode, and the other one of the electrodes is the secondary pickoff electrode.

2. The vibrating-type gyroscope element of claim 1, wherein:
   the plurality of electrodes includes one or more pairs of secondary pickoff electrodes arranged at locations apart from each other by a predetermined angle in the outer circumferential direction of the resonator, and
   the predetermined angle is (360×(M/N)) degrees, where M is an integer and is 0≤M≤N−1.

3. The vibrating-type gyroscope element of claim 2, further comprising:
   a magnetic field applier that applies a magnetic field to the electrodes in a direction crossing a front surface of the resonator.

4. An angular velocity sensor, comprising at least:
   the vibrating-type gyroscope element of claim 2;
   a primary AC power supply that applies an AC power with a predetermined frequency to the primary driving electrode;
   a primary detector that detects a voltage signal generated at the primary pickoff electrode;
   a secondary AC power supply that applies an AC power to the secondary driving electrode;
   a secondary detector that detects a voltage signal generated at the secondary pickoff electrode; and
   a computing unit that calculates an angular velocity based on an output signal from the secondary AC power supply.

5. The vibrating-type gyroscope element of claim 1, further comprising:
   a magnetic field applier that applies a magnetic field to the electrodes in a direction crossing a front surface of the resonator.

6. An angular velocity sensor, comprising at least:
   the vibrating-type gyroscope element of claim 5;
   a primary AC power supply that applies an AC power with a predetermined frequency to the primary driving electrode;
   a primary detector that detects a voltage signal generated at the primary pickoff electrode;
   a secondary AC power supply that applies an AC power to the secondary driving electrode;
   a secondary detector that detects a voltage signal generated at the secondary pickoff electrode; and
   a computing unit that calculates an angular velocity based on an output signal from the secondary AC power supply.

7. An angular velocity sensor device, said device comprising at least:
   the vibrating-type gyroscope element of claim 1;
   a primary AC power supply that applies an AC power with a predetermined frequency to the primary driving electrode;
   a primary detector that detects a voltage signal generated at the primary pickoff electrode;
   a secondary AC power supply that applies an AC power to the secondary driving electrode;
   a secondary detector that detects a voltage signal generated at the secondary pickoff electrode; and
   a computing unit that calculates an angular velocity based on an output signal from the secondary AC power supply.

8. The angular velocity sensor of claim 7, wherein:
   the primary detector is configured to output, to the primary AC power supply, an output signal based on the voltage signal generated at the primary pickoff electrode,
   the primary AC power supply is configured to apply, to the primary driving electrode, AC power with an amplitude and a frequency that is controlled based on the output signal from the primary detector, thereby to stabilize the first order vibration generated at the resonator,
   the secondary detector is configured to output, to the secondary AC power supply, an output signal based on the voltage signal generated at the secondary pickoff electrode
   the secondary AC power supply is configured to apply, based on the output signal from the secondary detector, AC power to the secondary driving electrode such that the second order vibration generated at the resonator is canceled, and the computing unit is configured to calculate the angular velocity based on the output signal from the secondary AC power supply.

9. The angular velocity sensor of claim 2, further comprising:
a switcher,
wherein:
the switcher is configured to disconnect connection between the primary AC power supply and one electrode of the plurality of electrodes and then connects the secondary AC power supply or the secondary detector to be functioned as the secondary driving electrode or the secondary pickoff electrode, and disconnects connection between the primary detector and another electrode of the plurality of electrodes and then connects the primary pickoff electrode or the primary AC power supply to be funtioned as the secondary detector or the secondary driving electrode, at a predetermined timing, and
the computing unit is configured to calculate the angular velocity based on output signals from the secondary AC power supply before and after a change of the connection relationships of the one electrode and the another electrode.

10. An angular velocity sensor, comprising:
a pair of angular velocity sensors, wherein:
one of the angular velocity sensors is the angular velocity sensor of claim 9,
the switcher of the one of the angular velocity sensors is configured to disconnect connection between the primary AC power supply and one electrode of the plurality of electrodes and then connect the secondary AC power supply of the secondary detector to be functioned as the secondary driving electrode or the secondary pickoff electrode, and disconnect connection between the primary detector and another electrode of the plurality of electrodes and then connect the primary pickoff electrode or the primary AC power supply to be functioned as the secondary detector or the secondary driving electrode, in a predetermined cycle,
in the other one of the angular velocity sensors, connection between the primary AC power supply and one electrode of the plurality of electrodes and connection between the primary detector and another electrode of the plurality of electrodes is configured to be maintained in the predetermined cycle, and
an output signal from the other one of the angular velocity sensors is corrected using a bias component included in an output signal from the one of the angular velocity sensors, and an angular velocity is calculated accordingly.

11. An angular velocity sensor, comprising at least:
a vibrating-type gyroscope element comprising: a fixed part; a resonator with a ring shape or a discoid shape; a plurality of supports connecting the resonator to the fixed part and vibratably supporting the resonator; and a plurality of electrodes formed in a plane of one of opposite surfaces of the resonator or in planes of the opposite surfaces of the resonator, wherein: the resonator has a cos $N\theta$ (where N is a natural number of two or more) mode of vibration, two of the plurality of electrodes are arranged in each of 4N orientations that axes of the plurality of electrodes are arranged at equiangular intervals in an outer circumferential direction of the resonator, the plurality of electrodes include:
a primary driving electrode that excites first order vibration of the resonator in the cos $N\theta$ mode; a primary pickoff electrode that detects the fast order vibration; a secondary pickoff electrode that detects second order vibration of the resonator; and a secondary driving electrode that drives the resonator such that the second order vibration is canceled, the primary pickoff electrode is arranged in a same one of the 4N orientations as the orientation of the primary driving electrode, and the secondary driving electrode is arranged in a same one of the 4N orientations as the orientation of the secondary pickoff electrode, further wherein the plurality of electrodes includes, in equal numbers, a set comprising the primary driving electrode and the primary pickoff electrode and a set comprising the secondary driving electrode and the secondary pickoff electrode;
a primary AC power supply that applies an AC power with a predetermined frequency to the primary driving electrode;
a primary detector that detects a voltage signal generated at the primary pickoff electrode;
a secondary AC power supply that applies an AC power to the secondary driving electrode;
a secondary detector that detects a voltage signal generated at the secondary pickoff electrode; and
a computing unit that calculates an angular velocity based on an output signal from the secondary AC power supply.

12. A vibrating-type gyroscope element, comprising at least:
a thread part;
a resonator with a ring shape or a discoid shape;
a plurality of supports connecting the resonator to the fixed part and vibratably supporting the resonator; and
a plurality of electrodes formed in a plane of one of opposite surfaces of the resonator or in planes of the opposite surfaces of the resonator; and
a magnetic field applier that applies a magnetic field to the electrodes in a direction crossing a front surface of the resonator,
the resonator having a cos $N\theta$ (where N is a natural number of two or more) mode of vibration,
two of the plurality of electrodes being arranged in each of 4N orientations that axes of the plurality of electrodes are arranged at equiangular intervals in an outer circumferential direction of the resonator,
the plurality of electrodes including:
a primary driving electrode that excites first order vibration of the resonator in the cos $N\theta$ mode;
a primary pickoff electrode that detects the first order vibration;
a secondary pickoff electrode that detects second order vibration of the resonator; and
a secondary driving electrode that drives the resonator such that the second order vibration is canceled,
the primary pickoff electrode being arranged in a same one of the 4N orientations as the orientation of the primary driving electrode, and
the secondary driving electrode being arranged in a same one of the 4N orientations as the orientation of the secondary pickoff electrode,
wherein the plurality of electrodes includes, in equal numbers, a set comprising the primary driving electrode and the primary pickoff electrode, and a set comprising the secondary driving electrode and the secondary pickoff electrode.

* * * * *